United States Patent
Kim et al.

(10) Patent No.: US 9,710,086 B2
(45) Date of Patent: Jul. 18, 2017

(54) DISPLAY DEVICE INTEGRATED WITH TOUCH SCREEN PANEL AND METHOD OF FABRICATING THE SAME

(71) Applicant: LG Display Co., Ltd., Seoul (KR)

(72) Inventors: MinJoo Kim, Seoul (KR); Taehwan Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 169 days.

(21) Appl. No.: 14/708,639

(22) Filed: May 11, 2015

(65) Prior Publication Data

US 2015/0331530 A1 Nov. 19, 2015

(30) Foreign Application Priority Data

May 13, 2014 (KR) .................. 10-2014-0057208

(51) Int. Cl.
G06F 3/041 (2006.01)
H01L 27/12 (2006.01)
G06F 3/044 (2006.01)

(52) U.S. Cl.
CPC ............ *G06F 3/0412* (2013.01); *G06F 3/044* (2013.01); *H01L 27/124* (2013.01); *G06F 2203/04103* (2013.01); *H01L 27/1248* (2013.01)

(58) Field of Classification Search
CPC ... G09G 3/36; G09G 3/30; G09G 5/00; G06F 3/041; G06F 3/045; G06F 3/02; G06F 3/042; G01R 27/26; B41J 5/00
See application file for complete search history.

(56) References Cited

U.S. PATENT DOCUMENTS

| | | | | |
|---|---|---|---|---|
| 6,927,808 B2* | 8/2005 | Ono | ............... | G02F 1/134363 349/141 |
| 2011/0310341 A1* | 12/2011 | Kim | ............... | H01L 27/1288 349/140 |
| 2013/0050292 A1* | 2/2013 | Mizukoshi | ......... | G09G 3/3291 345/690 |
| 2013/0162570 A1* | 6/2013 | Shin | ............... | G06F 3/041 345/173 |
| 2013/0215075 A1* | 8/2013 | Lee | ............... | G06F 3/044 345/174 |
| 2013/0342781 A1* | 12/2013 | Lee | ............... | G02F 1/1368 349/46 |
| 2015/0268745 A1* | 9/2015 | Li | ............... | G06F 3/044 345/173 |

* cited by examiner

*Primary Examiner* — Pegeman Karimi
(74) *Attorney, Agent, or Firm* — Fenwick & West LLP

(57) ABSTRACT

A fabrication method is described which reduces processes of fabricating display devices such as an in-cell type display device. The display device includes: a gate line over a substrate; a data line over the substrate; a thin-film-transistor (TFT) including a drain electrode and a source electrode, the TFT located at a pixel defined by an intersection between the gate line and the data line; a first electrode layer located to be spaced apart from one of the source electrode and the drain electrode of the TFT; and a second electrode and a connection pattern over the first electrode, both the second electrode and the connection pattern of a same material, the connection pattern connecting one of the source electrode or the drain electrode of the TFT to the first electrode.

18 Claims, 37 Drawing Sheets

DISPLAY DEVICE INTEGRATED WITH TOUCH SCREEN PANEL AND METHOD OF FABRICATING THE SAME

CROSS-REFERENCE TO RELATED APPLICATION

This application claims priority from and the benefit under 35 U.S.C. §119(a) of Korean Patent Application No. 10-2014-0057208, filed on May 13, 2014, which is hereby incorporated by reference for all purposes as if fully set forth herein.

BACKGROUND

1. Field of Technology

The present disclosure relates to a display device integrated with a touch screen panel and a method of fabricating the same.

2. Description of the Prior Art

With the progress of an information-oriented society, demands for display devices for displaying images have increased in various forms. Recently, various display devices, such as a Liquid Crystal Display (LCD), a Plasma Display Panel (PDP), an Organic Light Emitting Diode (OLED) display device, etc., have been utilized.

Such a display device provides a touch-based input scheme which enables a user to deviate from a conventional input scheme, in which a button, a keyboard, a mouse, and the like are used, and to input information or a command easily, intuitively and conveniently.

In order to provide the touch-based input scheme, whether there is a touch by the user must be recognized, and touch coordinates must be accurately detected.

To this end, conventionally, touch sensing is provided by employing one of various touch schemes, such as a resistive scheme, a capacitive scheme, an electromagnetic induction scheme, an infrared scheme, and an ultrasonic scheme, and the like.

Also, in the case of applying a touch screen to the display device, development in which a touch sensor is mounted within the display device has been performed. Particularly, an in-cell type display device has been developed which utilizes a common electrode formed on a lower substrate as a touch sensing electrode. In this regard, the in-cell type display device must have a touch sensing electrode formed therein, and thus requires a specific process. Moreover, the in-cell type display device requires high manufacturing costs and a lot of time for fabrication, and thus leads to a reduction in the competitiveness of the product.

SUMMARY

An aspect of the present disclosure is to provide a structure and a method which reduce specific processes of fabricating an in-cell type display device.

In order to solve the above-mentioned technical problem, in accordance with an aspect of the present disclosure, there is provided a display device which includes: a gate line over a substrate, the gate line in a first direction and the gate line configured to receive a gate signal; a data line over the substrate, the data line in a second direction and the data line configured to receive a data signal; a thin-film-transistor (TFT) including a drain electrode and a source electrode, the TFT located at a pixel defined by an intersection between the gate line and the data line; a first electrode layer located to be spaced apart from one of the source electrode and the drain electrode of the TFT; and a second electrode and a connection pattern over the first electrode, both the second electrode and the connection pattern of a same material, the connection pattern connecting one of the source electrode or the drain electrode of the TFT to the first electrode.

In accordance with another embodiment of the present disclosure, there is provided a display device which includes: a display panel including: a plurality of gate lines over a substrate, the plurality of gate lines in a first direction and the plurality of gate lines configured to receive gate signals; a plurality of data lines over the substrate, the plurality of data lines in a second direction and the plurality of data lines configured to receive data signals; a thin-film-transistor (TFT) including a drain electrode and a source electrode, the TFT located at a pixel defined by an intersection between the one of the plurality of gate lines and one of the plurality of data lines; a first electrode that is located to be spaced apart from one of the source electrode and the drain electrode of the TFT; a second electrode and a connection pattern over the first electrode, both the second electrode and the connection pattern of a same material. The display device also includes: a touch integrated circuit configured to apply a touch driving signal to the second electrode during a touch driving mode of the display device; a data driver configured to transmit the data signals to the plurality of data lines during a display driving mode of display device; and a gate driver configured to transmit the gate signals to the plurality of gate lines during the display driving mode of the display device.

In accordance with still another aspect of the present disclosure, there is provided one embodiment of a method of fabricating a signal line of a display device having a touch sensor mounted therein. The method includes: forming a thin-film-transistor (TFT) over a substrate, the TFT including a source electrode and a drain electrode; forming a first passivation layer over the TFT, the first passivation layer covering the TFT; forming a planarization layer over the first passivation layer; forming a first electrode layer on the planarization layer; forming a second electrode layer on the first electrode layer; forming a touch signal line by etching the second electrode layer using a first photomask, the touch signal line configured to receive a touch driving signal; forming a first electrode by etching the first electrode layer and the planarization layer using a second photomask; applying a second passivation layer over the touch signal line and the first electrode; exposing a part of the source electrode or a part of the drain electrode of the TFT by etching the first passivation layer and the second passivation layer using a third photomask; and forming a connection pattern that connects the first electrode to the exposed part of the source electrode or the drain electrode of the TFT using a fourth photomask.

As described above, the present disclosure can provide the fabrication method which reduces the specific processes of fabricating the in-cell type display device, and the display device.

BRIEF DESCRIPTION OF THE DRAWINGS

The above and other objects, features and advantages of the present disclosure will be more apparent from the following detailed description taken in conjunction with the accompanying drawings, in which.

DETAILED DESCRIPTION

Figure 1:
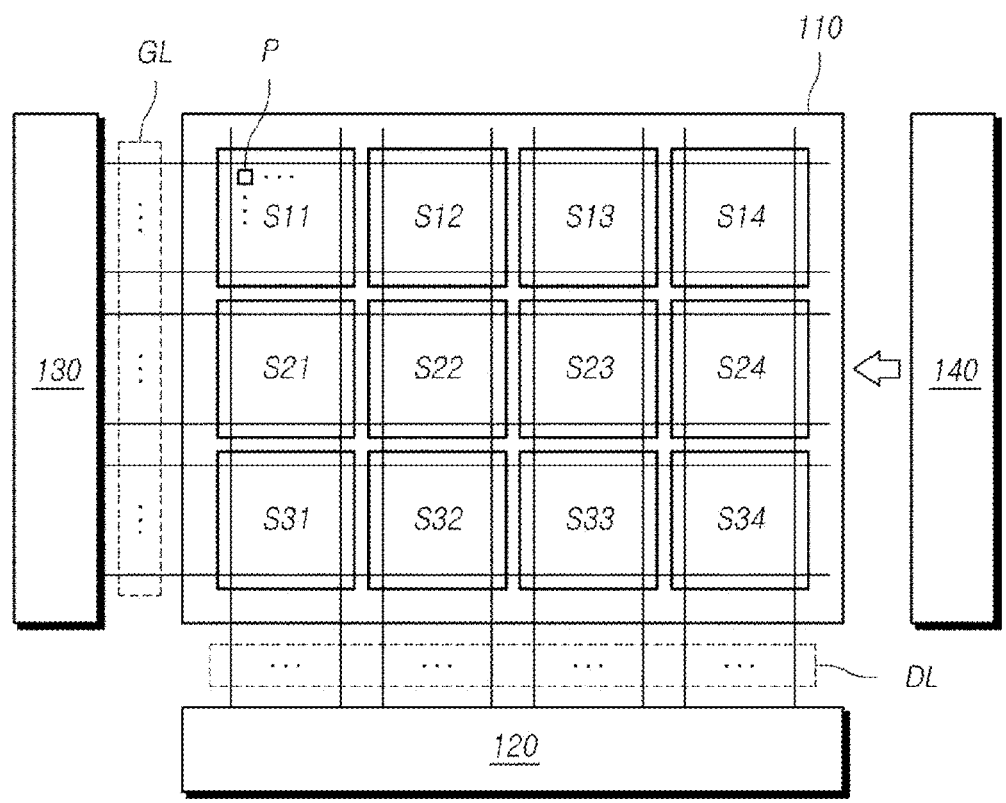
FIG. 1 is a plan view schematically illustrating an example of a display device integrated with a touch screen panel according to one embodiment.

Hereinafter, embodiments of the present disclosure will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may be "connected to", "be coupled to", or "be in contact with" the structural elements as well as that the certain structural element is directly connected to or is in direct contact with another structural element.

The present disclosure provides a structure and a method which reduce processes by combining a process of contacting a pixel electrode with a source or drain with a process of forming a common electrode.

FIG. 1 is a plan view schematically illustrating an example of a display device integrated with a touch screen panel according to one embodiment.

Referring to FIG. 1, the display device 100 integrated with the touch screen panel includes a panel 110, a data driver 120, a gate driver 130, an integrated circuit 140 for controlling a touch signal (hereinafter, referred to as a "touch integrated circuit"), and the like.

In the panel 110, multiple data lines DL are formed in a first direction (e.g., a vertical direction or a horizontal direction) and multiple gate lines GL are formed in a second direction (e.g., the horizontal direction or vertical direction), and multiple corresponding pixels Ps are defined at each of intersections between the multiple data lines DL and the multiple gate lines GL.

At a pixel region of each pixel P, a source electrode or a drain electrode of a transistor is connected to a data line DL, a gate electrode is connected to a gate line GL, and either of the drain electrode and the source electrode of the transistor is connected to a pixel electrode.

Also, in the panel 110, multiple electrodes S11 to S14, S21 to S24, and S31 to S34, which are grouped or blocked into multiple electrode groups, are further formed to be spaced apart from each other.

The panel 110 serves as a display panel as well as a Touch Screen Panel (TSP).

Specifically, the panel 110 may be a panel into which a display panel and a TSP are integrated, or may be configured in an in-cell type in which the TSP is built in a cell of the display panel.

When the panel 110 functions as a display panel, a driving mode of the panel 110 is referred to as a "display driving mode." When the panel 110 functions as a TSP, a driving mode of the panel 110 is referred to as a "touch driving mode."

When a driving mode of the panel 110 is a display driving mode, the data driver 120 supplies a data voltage Vdata or data signal for display to the multiple data lines DL. When the driving mode of the panel 110 is the display driving mode, the gate driver 130 sequentially supplies a gate signal or scan signal for display to the multiple gate lines GL.

When the driving mode of the panel 110 is a touch driving mode, the touch integrated circuit 140 applies a touch driving signal to all or some of the multiple electrodes S11 to S14, S21 to S24 and S31 to S34 which are directly connected through touch signal lines. Here, the touch driving signal is also referred to as a "touch sensing signal," "touch sensing voltage," or "touch driving voltage Vtd." For example, when the driving mode of the panel 110 is the touch driving mode, the touch integrated circuit 140 applies a touch driving signal to all or some of multiple electrode groups into which the multiple electrodes S11 to S14, S21 to S24, and S31 to S34 are grouped.

Meanwhile, the display device 100 integrated with the touch screen panel may further include a timing controller (not illustrated) that controls a driving timing of each of the data driver 120 and the gate driver 130. Also, the display device 100 integrated with the touch screen panel may further include a touch controller (not illustrated) that detects whether there is a touch by a user, touch coordinates, and the like after receiving sensing data (e.g., a capacitance, a variance in capacitance, a voltage, etc.) measured by the touch integrated circuit 140 through the multiple electrodes S11 to S14, S21 to S24, and S31 to S34 that serve as touch electrodes.

Meanwhile, the panel 110 of the display device 100 integrated with the touch screen panel is driven while repeating the display driving mode and the touch driving mode. A timing of the display driving mode and the touch driving mode may be controlled by a control signal which has been output from the timing controller, the touch controller, or the like. According to circumstances, the timing of the display driving mode and the touch driving mode may be controlled by the timing controller and the touch controller which operate in cooperation with each other.

Further, the display device 100 integrated with the touch screen panel is of a touch type, and employs a capacitance touch scheme for detecting whether there is a touch by the user, touch coordinates, and the like on the basis of a change in capacitance through the multiple touch electrodes (e.g., the electrodes in the horizontal direction and the electrodes in the vertical direction) formed in the TSP.

The capacitance touch schemes may be classified into, for example, a mutual capacitance touch scheme, a self capacitance touch scheme, and the like.

In the mutual capacitance touch scheme which is one of the capacitance touch schemes, among an electrode in the horizontal direction and an electrode in the vertical direction, the electrode in one direction becomes a Tx electrode (referred to as a "driving electrode"), to which a driving voltage is applied, and the electrode in the other direction becomes an Rx electrode (referred to as a "sensing electrode") that senses the driving voltage and forms a capacitance between itself and the Tx electrode. Accordingly, detection is made of whether there is a touch by the user, touch coordinates, and the like on the basis of a change in capacitance (i.e., mutual capacitance) between the Tx electrode and the Rx electrode which depends on whether there is a pointer, such as a finger, a pen, and the like.

In the self capacitance touch scheme which is another type of the capacitance touch scheme, each touch electrode forms a capacitance (i.e., a self capacitance) between itself and a pointer (e.g., a finger, a pen, etc.), measurement is made based on the value of the capacitance between each touch electrode and the pointer which depends on whether there is the pointer, and detection is made of whether there is a touch by the user, touch coordinates, and the like on the basis of the measured capacitance value. In the self capacitance touch scheme, differently from the mutual capacitance touch scheme, a driving voltage (i.e., a touch driving signal) is applied and is simultaneously sensed through each touch electrode. Accordingly, in the self capacitance touch scheme, a Tx electrode is not distinguished from an Rx electrode.

The display device 100 integrated with the touch screen panel may employ one of the above-described two types of capacitance touch schemes (i.e., the mutual capacitance touch scheme and the self capacitance touch scheme). In this regard, in this specification, for convenience of description, an example will be described in which the display device 100 integrated with the touch screen panel employs the self capacitance touch scheme.

The data driver 120 may include at least one data driver Integrated Circuit (IC) (also referred to as a "source driver IC"). The at least one data driver IC may be connected to a bonding pad of the panel 110 according to a Tape Automated Bonding (TAB) scheme or a Chip On Glass (COG) scheme, or may be directly formed in the panel 110. According to circumstances, the at least one data driver IC may be formed to be integrated in the panel 110.

According to a driving scheme, the gate driver 130 may be disposed at only one side of the panel 110 as illustrated in FIG. 1, or may be divided into two parts and may be disposed at both sides of the panel 110. Also, the gate driver 130 may include at least one gate driver IC. The at least one gate driver IC may be connected to a bonding pad of the panel 110 according to the TAB scheme or the COG scheme, or may be implemented in a Gate In Panel (GIP) type and may be directly formed in the panel 110. According to circumstances, the at least one gate driver IC may be formed to be integrated in the panel 110.

The touch Integrated Circuit (IC) 140 is an element, which is separated from the data driver 120 and the gate driver 130, as illustrated in FIG. 1, and may be disposed outside the data driver 120 and the gate driver 130. However, according to an implementation scheme, the touch IC 140 may be implemented as an internal element of another separate driver IC (e.g., a display driver IC) which may include at least one of the data driver 120 and the gate driver 130. Alternatively, the touch IC 140 may be implemented as an internal element of the data driver 120 or the gate driver 130.

Accordingly, in the touch driving mode, that the touch IC 140 applies a touch driving signal to all or some of the multiple electrodes serving as touch electrodes may be regarded as that a separate driver IC including the touch IC 140 applies a touch driving signal to all or some of the multiple electrodes serving as the touch electrodes. According to a design scheme, such a configuration may be regarded as that the data driver 120 or the gate driver 130 including the touch IC 140 applies a touch driving signal to all or some of the multiple electrodes serving as the touch electrodes.

Without being limited to the implementation scheme and the design scheme of the touch IC 140, when an element only has execution functions identical or similar to those of the touch IC 140 described in this specification, the touch IC 140 may be any other element itself, or may be an internal or external element. Also, although one touch IC 140 is illustrated in FIG. 1, two or more touch ICs may be implemented.

Meanwhile, in order to apply a touch driving signal to all or some of the multiple electrodes (e.g., the electrodes S11 to S14, S21 to S24, and S31 to S34), the touch IC 140 requires a configuration in which separate signal lines are respectively connected to the multiple electrodes S11 to S14, S21 to S24, and S31 to S34.

At least one signal line, which is respectively connected to the multiple electrodes S11 to S14, S21 to S24, and S31 to S34 and delivers a touch driving signal or a common voltage thereto, may be formed in a first direction (e.g., the vertical direction) or a second direction (e.g., the horizontal direction) in the panel 110.

When the number of signal lines respectively connected to the multiple electrodes S11 to S14, S21 to S24, and S31 to S34 is equal to 2 or more, it is advantageous in that resistance can be reduced.

Meanwhile, a direction for forming the at least one signal line, which is respectively connected to the multiple electrodes S11 to S14, S21 to S24, and S31 to S34, may depend on whether the multiple electrodes S11 to S14, S21 to S24, and S31 to S34 are to be sensed in such a manner as to be grouped in the first direction (e.g., the vertical direction) of forming the data lines, or whether the multiple electrodes S11 to S14, S21 to S24, and S31 to S34 are to be sensed in such a manner as to be grouped in the second direction (e.g., the horizontal direction) of forming the gate lines.

Figure 3:
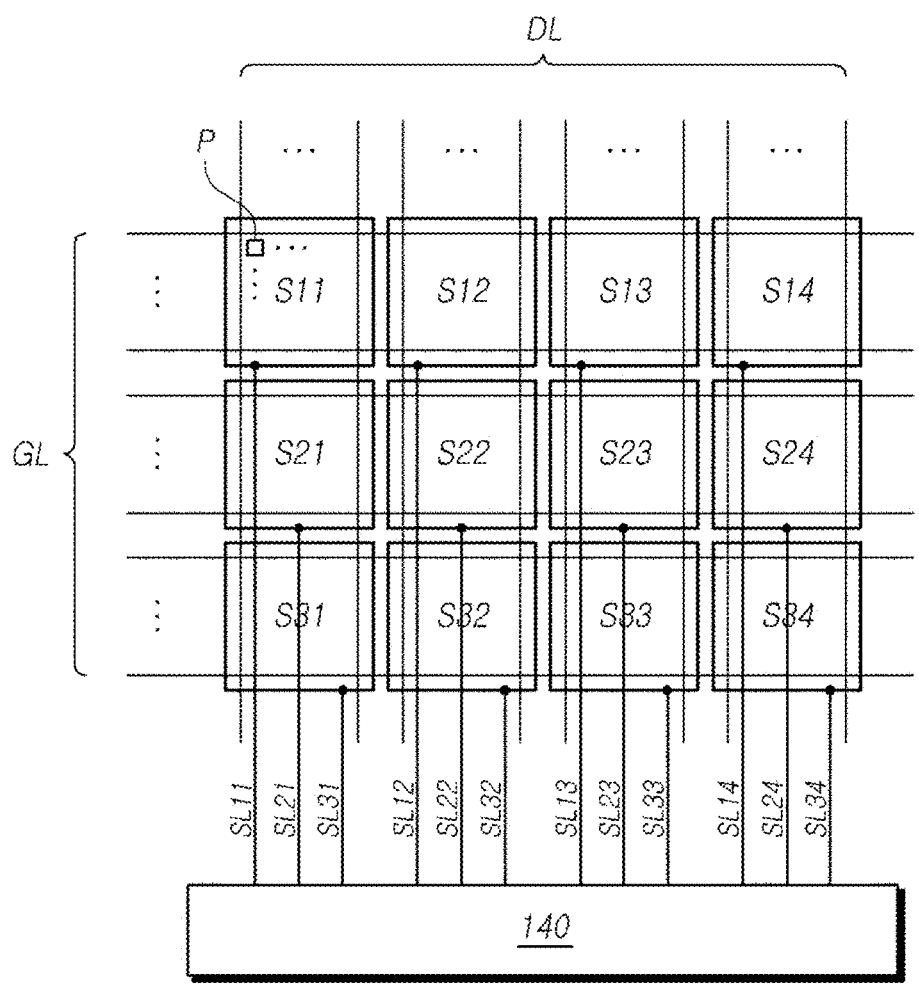
FIG. 3 is a plan view illustrating a panel included in an example of a display device integrated with a touch screen panel according to one embodiment.

When the multiple electrodes S11 to S14, S21 to S24, and S31 to S34 are sensed in such a manner as to be grouped in the first direction (e.g., the vertical direction) of forming the data lines, the at least one signal line, which is respectively connected to the multiple electrodes S11 to S14, S21 to S24 and S31 to S34, may be formed in the first direction of forming the data lines (refer to FIG. 3).

Figure 5:
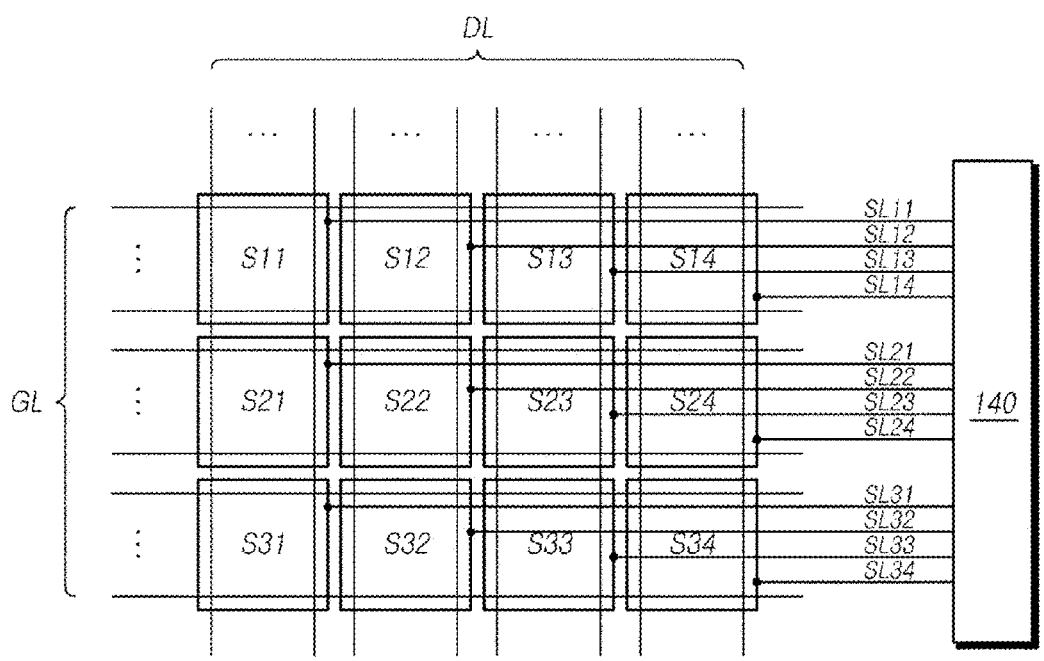
FIG. 5 is another plan view illustrating a panel included in an example of a display device integrated with a touch screen panel according to one embodiment.

When the multiple electrodes S11 to S14, S21 to S24, and S31 to S34 are sensed in such a manner as to be grouped in the second direction (e.g., the horizontal direction) of forming the gate lines, the at least one signal line, which is respectively connected to the multiple electrodes S11 to S14, S21 to S24 and S31 to S34, may be formed in the second direction of forming the gate lines (refer to FIG. 5).

When a driving mode is the touch driving mode, as described above, the multiple electrodes S11 to S14, S21 to S24, and S31 to S34 described in this specification serve as touch electrodes, to all or some of which a touch driving signal is. When a driving mode is the display driving mode, the multiple electrodes S11 to S14, S21 to S24 and S31 to S34 described in this specification serve as common electrodes which face pixel electrodes in formed the panel 110 and to which a common voltage Vcom is applied.

The display device 100 integrated with the touch screen panel may be, for example, an In-Plane Switching (IPS) type LCD device which employs a scheme for horizontally arranging liquid crystal molecules and expressing a screen while rotating each of the liquid crystal molecules at an identical place, and which has advantages such as a high resolution, low power consumption, a wide viewing angle, and the like. More specifically, the display device 100 integrated with the touch screen panel may be an Advanced High Performance-IPS (AH-IPS) LCD device.

At this time, during the display driving mode, pixel electrodes and the common pixels S11 to S14, S21 to S24, and S31 to S34 may be formed on an identical substrate so as to form a horizontal electric field between the pixel electrodes and the common pixels S11 to S14, S21 to S24, and S31 to S34.

In another example, the display device 100 integrated with the touch screen panel may be an organic light emitting display device having organic light emitting layers formed between pixel electrodes and common electrodes. Here, the pixel electrodes and the common electrodes may be formed on an identical substrate.

Figure 2:
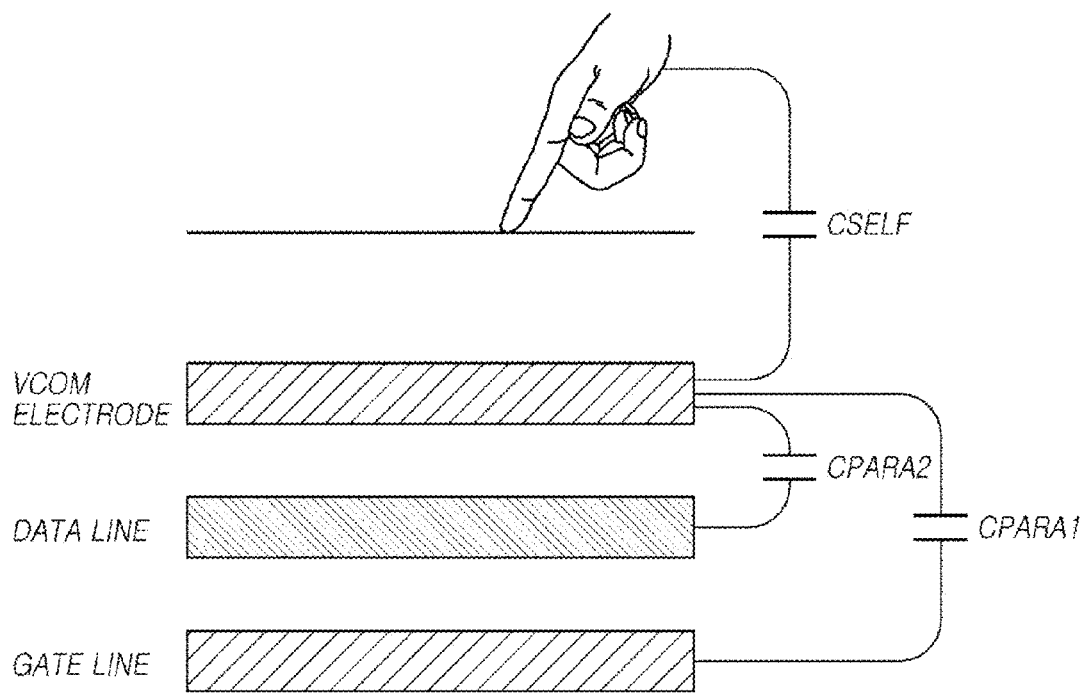
FIG. 2 is a view illustrating Cself, Cpara1 and Cpara2 which are capacitance components generated during a touch driving mode in an example of a display device integrated with a touch screen panel according to one embodiment.

FIG. 2 is a view illustrating Cself, Cpara1, and Cpara2 which are capacitance components generated during a touch driving mode in an example of a display device integrated with a touch screen panel.

Referring to FIG. 2, in the touch driving mode, the multiple electrodes S11 to S14, S21 to S24, and S31 to S34, which serve as the touch electrodes in the touch driving mode and serve as the common electrodes forming liquid crystal capacitors between the multiple electrodes and the pixel electrodes in the display driving mode, form a self capacitance Cself between the multiple electrodes and a pointer (e.g., a finger, a pen, etc.) in order to detect whether there is a touch by the user, touch coordinates, and the like. Meanwhile, the multiple electrodes S11 to S14, S21 to S24, and S31 to S34, which serve as the common electrodes, may also form parasitic capacitances Cpara1 and Cpara2 between the multiple electrodes and the gate lines and data lines. For example, as shown in FIG. 2 parasitic capacitance Cpara1 is formed between the Vcom electrode and a gate line whereas parasitic capacitance Cpara2 is formed between the Vcom electrode and a data line. However, the parasitic capacitances are even smaller than the self capacitance, and thus can be neglected.

Hereinafter, a more detailed description will be made of the panel 110, a scheme for applying a common voltage and a touch driving signal to the multiple electrodes S11 to S14, S21 to S24, and S31 to S34 serving as both the common electrodes and the touch electrodes, a scheme for applying a data voltage and a touch driving signal (or a signal corresponding to the touch driving signal) to the data lines DL, a scheme for applying a data voltage and a touch driving signal (or a signal corresponding to the touch driving signal) to the gate lines GL, and the like, which are included in the display device 100 integrated with the touch screen panel.

First, the panel 110 included in the display device 100 integrated with the touch screen panel will be described in more detail with reference to FIGS. 3 to 5.

FIG. 3 is a plan view illustrating a panel included in an example of a display device integrated with a touch screen panel according to one embodiment. Referring to FIG. 3, as described above, the panel 110 has, formed therein, the multiple data lines DL, the multiple gate lines GL, and the multiple electrodes S11 to S14, S21 to S24, and S31 to S34.

Also, as described above, the panel 110 may operate in the display driving mode or touch driving mode. In this regard, the multiple data lines DL and the multiple gate lines GL formed in the panel 110 correspond to a configuration which allows the panel 110 to serve as a display panel. In addition, the multiple electrodes S11 to S14, S21 to S24, and S31 to S34 formed in the panel 110 are a configuration which allows the panel 110 to serve as both a display panel and a TSP.

More specifically, when the panel 110 serves as a display panel, namely, when a driving mode of the panel 110 is the display driving mode, a common voltage Vcom is applied to the multiple electrodes S11 to S14, S21 to S24 and S31 to S34, and the multiple electrodes S11 to S14, S21 to S24, and S31 to S34 become common electrodes (hereinafter also referred to as "Vcom electrodes") which face the pixel electrodes (not illustrated).

When the panel 110 serves as a TSP, namely, when a driving mode of the panel 110 is the touch driving mode, a touch driving voltage is applied to the multiple electrodes S11 to S14, S21 to S24, and S31 to S34, and the multiple electrodes S11 to S14, S21 to S24, and S31 to S34 form a capacitor between the multiple electrodes and a touch pointer (e.g., a finger, a pen, etc.). The multiple electrodes S11 to S14, S21 to S24, and S31 to S34 become touch electrodes, on which a capacitance of the formed capacitor is measured.

In other words, the multiple electrodes S11 to S14, S21 to S24 and S31 to S34 serve as the Vcom electrodes in the display driving mode, and serve as the touch electrodes in the touch driving mode. The common voltage Vcom is applied to the multiple electrodes S11 to S14, S21 to S24, and S31 to S34 during the display driving mode, and a touch driving signal is applied to the multiple electrodes S11 to S14, S21 to S24 and S31 to S34 during the touch driving mode.

Accordingly, as illustrated in FIG. 3, in order to deliver the common voltage Vcom or the touch driving signal to the multiple electrodes S11 to S14, S21 to S24, and S31 to S34, signal lines SL11 to SL14, SL21 to SL24 and SL31 to SL34 may be connected to the multiple electrodes S11 to S14, S21 to S24 and S31 to S34.

Therefore, during the touch driving mode, a touch driving signal Vtd generated by the touch IC 140 is delivered to all or some of the multiple electrodes S11 to S14, S21 to S24, and S31 to S34 through the signal lines SL11 to SL14, SL21 to SL24, and SL31 to SL34. During the display driving mode, the common voltage Vcom supplied by a common voltage supplier (not illustrated) is applied to the multiple electrodes S11 to S14, S21 to S24, and S31 to S34 through the signal lines SL11 to SL14, SL21 to SL24, and SL31 to SL34.

Referring to FIG. 3, one corresponding pixel P is defined at each of intersections between the multiple data lines DL and the multiple gate lines GL formed in the panel 110. Here, each pixel may be one of a red (R) pixel, a green (G) pixel, and a blue (B) pixel.

Referring to FIG. 3, two or more pixels Ps may be defined in a region (hereinafter also referred to as a "unit touch electrode region") where each of the multiple electrodes S11 to S14, S21 to S24, and S31 to S34 is formed which serve as the common electrodes as well as the touch electrodes. Specifically, one of the multiple electrodes S11 to S14, S21 to S24, and S31 to S34 corresponds to two or more pixels Ps.

For example, 24*3 data lines DL and 24 gate lines GL are disposed in one region (i.e., a unit touch electrode region) where each of the multiple electrodes S11 to S14, S21 to S24, and S31 to S34 is formed which serve as the common electrodes as well as the touch electrodes. Accordingly, 24*3*24 pixels Ps may be defined.

Meanwhile, as illustrated in FIG. 3, each of the multiple electrodes S11 to S14, S21 to S24, and S31 to S34 which serve as the common electrodes as well as the touch electrodes may have a block-shaped pattern, or may have a pattern including a finger-shaped part according to circumstances.

The present disclosure may be applied even to a case where each of the multiple electrodes S11 to S14, S21 to S24 and S31 to S34 which serve as the common electrodes as well as the touch electrodes has a pattern including a finger-shaped part.

In many drawings, the multiple electrodes serving as the common electrodes as well as the touch electrodes, which are described in this specification, are illustrated as being disposed in the form of a 3×4 matrix and as having the number thereof of 12. However, this configuration is only an example for the convenience of description. Accordingly, in view of the size of each of the display device 100 integrated with the touch screen panel and the panel 110, touch system design standards, and the like, the multiple electrodes serving as the common electrodes as well as the touch electrodes may be formed in the form of various matrices and with the various numbers thereof.

Figure 4:
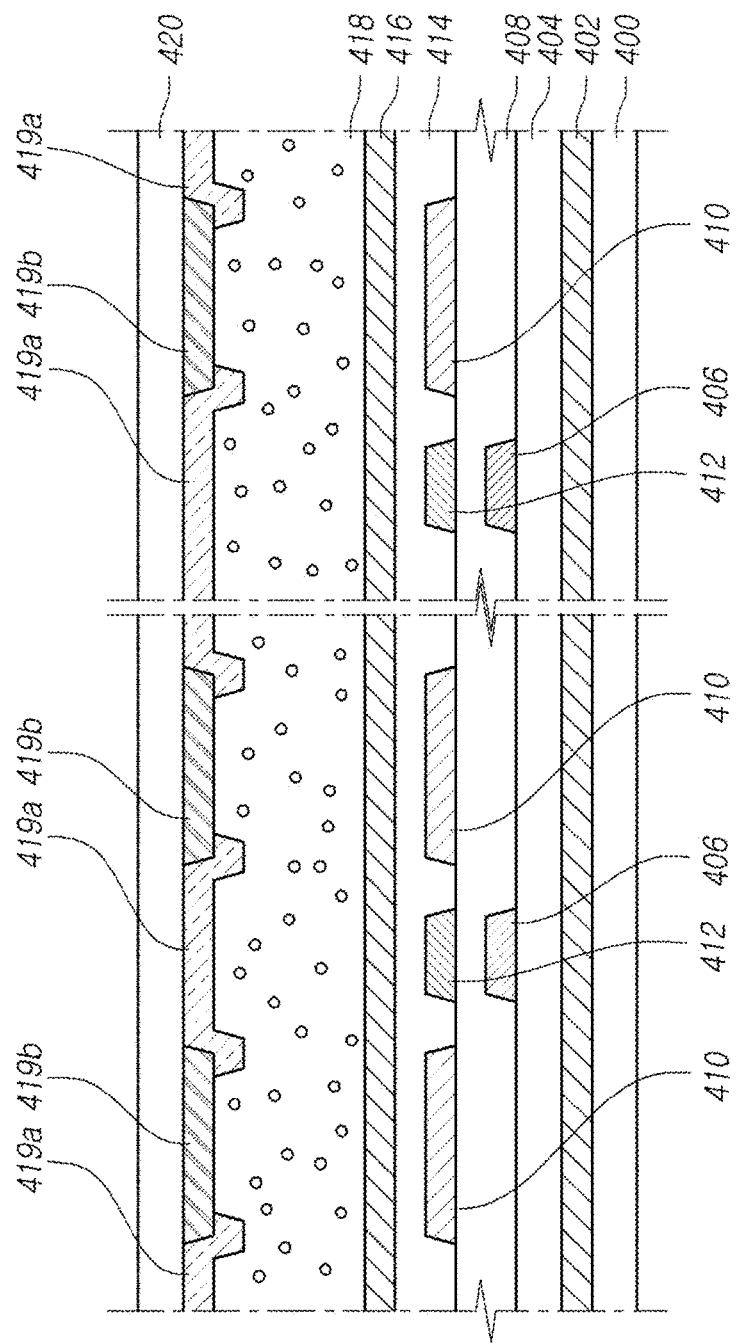
FIG. 4 is a view illustrating an example of a cross-sectional view of a panel when an example of a display device integrated with a touch screen panel is a liquid crystal display device according to one embodiment.

FIG. 4 is a view illustrating an example of a cross-sectional view of a panel when an example of a display device integrated with a touch screen panel is a liquid crystal display device according to one embodiment. Furthermore, FIG. 4 illustrates a region (i.e., a touch electrode region) where one electrode is formed among the multiple electrodes S11 to S14, S21 to S24 and S31 to S34 which serve as the common electrodes as well as the touch electrodes according to one embodiment.

Referring to FIG. 4, in the panel 110 included in the display device 100 integrated with the touch screen panel, for example, gate lines 402 are formed on a lower substrate 400 (i.e., a first substrate) in a second direction, namely, a horizontal direction (a left-and-right direction in FIG. 4), and a gate insulator 404 is formed on the gate lines 402. Data lines 406 are formed on the gate insulator 404 in a first direction, namely, a vertical direction, (a direction perpendicular to the ground in FIG. 4), and a first passivation layer 408 is formed on the data lines 406.

A pixel electrode 410 and a signal line 412 of each pixel region may be formed on the first passivation layer 408, and a second passivation layer 414 may be formed on the pixel electrode 410 and the signal line 412. Here, the signal lines 412 are connected from the respective multiple electrodes S11 to S14, S21 to S24 and S31 to S34, which serve as the common electrodes as well as the touch electrodes, to the touch IC 140. Accordingly, in the display driving mode, the signal lines 412 deliver a common voltage Vcom generated by the common voltage supplier to the multiple electrodes S11 to S14, S21 to S24, and S31 to S34. In the touch driving mode, the signal lines 412 deliver a touch driving signal generated by the touch IC 140 to the multiple electrodes S11 to S14, S21 to S24, and S31 to S34.

One electrode 416 serving as a common electrode as well as a touch electrode is formed on the second passivation layer 414, and a liquid crystal layer 418 is formed on the one electrode 416. Here, the one electrode 416 serving as a common electrode as well as a touch electrode is one of the multiple electrodes S11 to S14, S21 to S24 and S31 to S34, and may have a block-shaped pattern.

An upper substrate 420 (i.e., a second substrate), on which a black matrix 419a, a color filter 419b, and the like are formed, is located on the liquid crystal layer 418.

FIG. 5 is another plan view illustrating a panel included in an example of a display device integrated with a touch screen panel according to one embodiment. Referring to FIG. 5, differently from FIG. 3, the signal lines SL11 to SL14, SL21 to SL24, and SL31 to SL34, which are connected to the respective multiple electrodes S11 to S14, S21 to S24, and S31 to S34 and deliver a touch driving signal or a common voltage thereto, may be formed in parallel to a second direction (e.g., a horizontal direction) in which the gate lines GL are formed.

In this case, a touch driving signal generated by the touch IC 140 or a common voltage generated or supplied by the common voltage supplier may be delivered to all or some of the multiple electrodes S11 to S14, S21 to S24, and S31 to S34 through the signal lines SL11 to SL14, SL21 to SL24, and SL31 to SL34 which are formed in parallel with the gate lines GL.

Hereinafter, fabrication process steps will be described for fabricating the signal lines (indicated by SL11 to SL14, SL21 to SL24, and SL31 to SL34 in FIG. 3 or FIG. 5, and hereinafter referred to as "touch signal lines") which deliver a touch driving signal to the common electrodes as described with reference to FIGS. 1 to 5. Then, fabrication process steps of the present disclosure, which reduce these fabrication process steps, will be described.

In a fabrication process step, a touch signal line is referred to as a "third electrode layer" (i.e., an M3L or a third conductive layer). In the in-cell touch of in-cell type display device as described above, it is necessary to form separate signal lines in order to form electrodes which are grouped or blocked and provide a common voltage, and the number of separate masks necessary to form the signal lines may increase. Accordingly, in order to reduce the number of masks, one mask may be applied to the formation of a pixel electrode and a planarization layer, and one mask may also be applied to the formation of passivation layers.

A thin-film-transistor (TFT) formed on a substrate to which the present disclosure can be applied may use, for example, amorphous silicon (hereinafter referred to as "a-Si"), metal oxide, or poly-silicon. Examples of poly-silicon may include low temperature poly-silicon (hereinafter referred to as "LTPS"), high temperature poly-silicon, (hereinafter referred to as "HTPS"), and the like, without being limited thereto.

Figure 6:
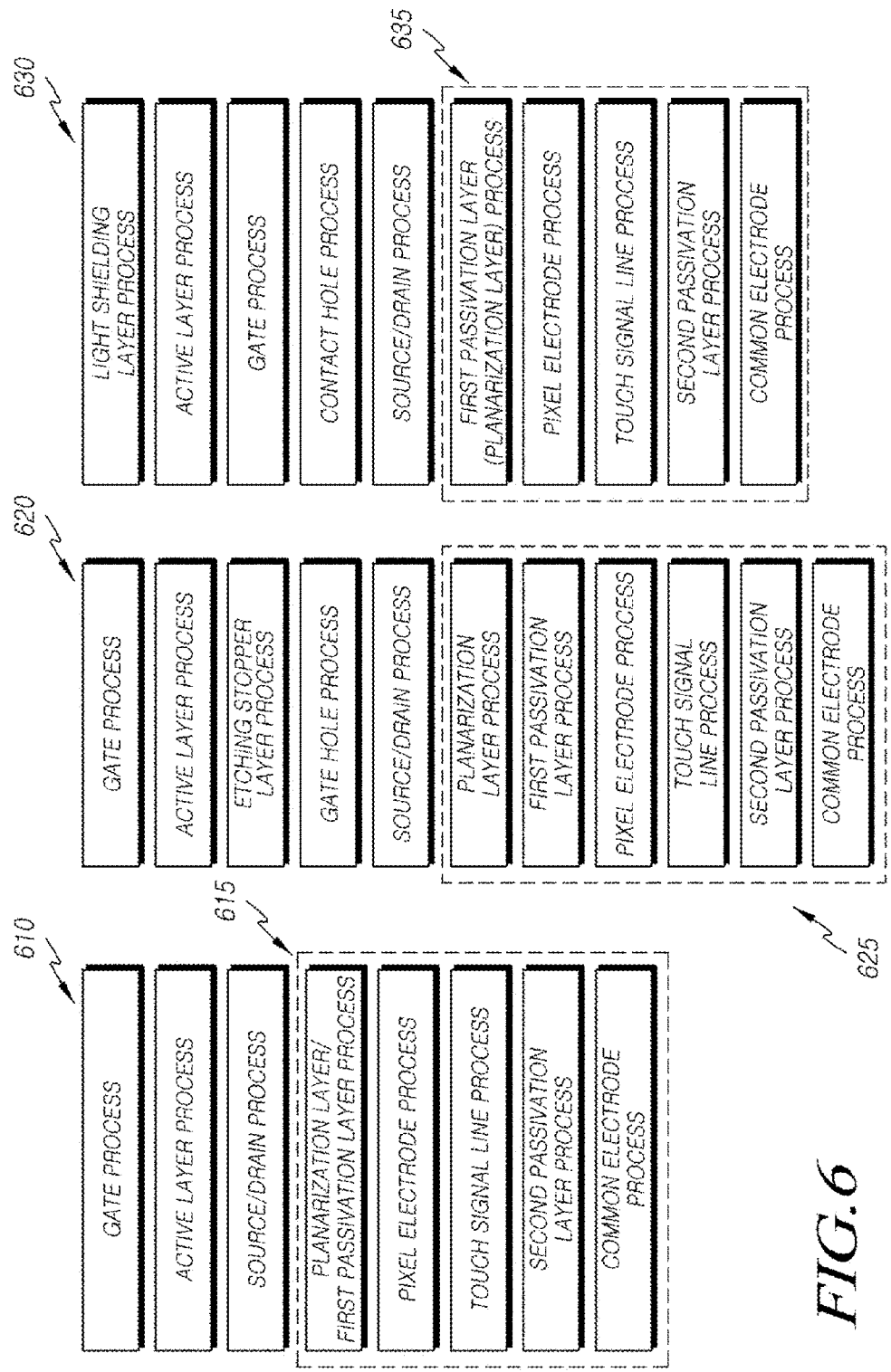
FIG. 6 is a view illustrating a fabrication process of a substrate for each thin film transistor according to one embodiment.

FIG. 6 is a view illustrating a fabrication process of a substrate for each TFT according to one embodiment. A method of fabricating an a-Si TFT substrate as indicated by reference numeral 610 includes forming a gate electrode (e.g., a gate process), forming an active layer (e.g., an active layer process); forming a source electrode and a drain electrode (e.g., a source/drain process); forming a planarization layer and a first passivation layer (e.g., a planarization layer/first passivation layer process); forming a pixel electrode (e.g., a pixel electrode process); forming a touch signal line (e.g., a touch signal line process); forming a second passivation layer (e.g., a second passivation layer process); and forming a common electrode (e.g., a common electrode process).

A method of fabricating a metal oxide TFT substrate as indicated by reference numeral 620 includes forming a gate electrode (e.g., a gate process); forming an active layer (e.g., an active layer process); forming an etching stopper layer (e.g., an etching stopper layer process); forming a gate hole (G-hole) (e.g., a gate hole process); forming a source electrode and a drain electrode (e.g., a source/drain process); forming a planarization layer (e.g., a planarization layer process); forming a first passivation layer (e.g., a first passivation layer process); forming a pixel electrode (e.g., a pixel electrode process); forming a touch signal line (e.g., a touch signal line process); forming a second passivation layer (e.g., a second passivation layer process); and forming a common electrode (e.g., a common electrode process).

A method of fabricating a LTPS TFT substrate as indicated by reference numeral 630 includes forming a light shielding layer (i.e., a Light Shield (LS)) (e.g., a light shielding layer process); forming an active layer (e.g., an active layer process); forming a gate electrode (e.g., a gate process); forming a contact hole (e.g., a contact hole process); forming a source electrode and drain electrode (e.g., a source/drain process); forming a first passivation layer (or a planarization layer) (e.g., a first passivation layer (planarization layer) process); forming a pixel electrode (e.g., a pixel electrode process); forming a touch signal line (e.g., a touch signal line process); forming a second passivation layer (e.g., a second passivation layer process); and forming a common electrode (e.g., a common electrode process).

Figure 7:
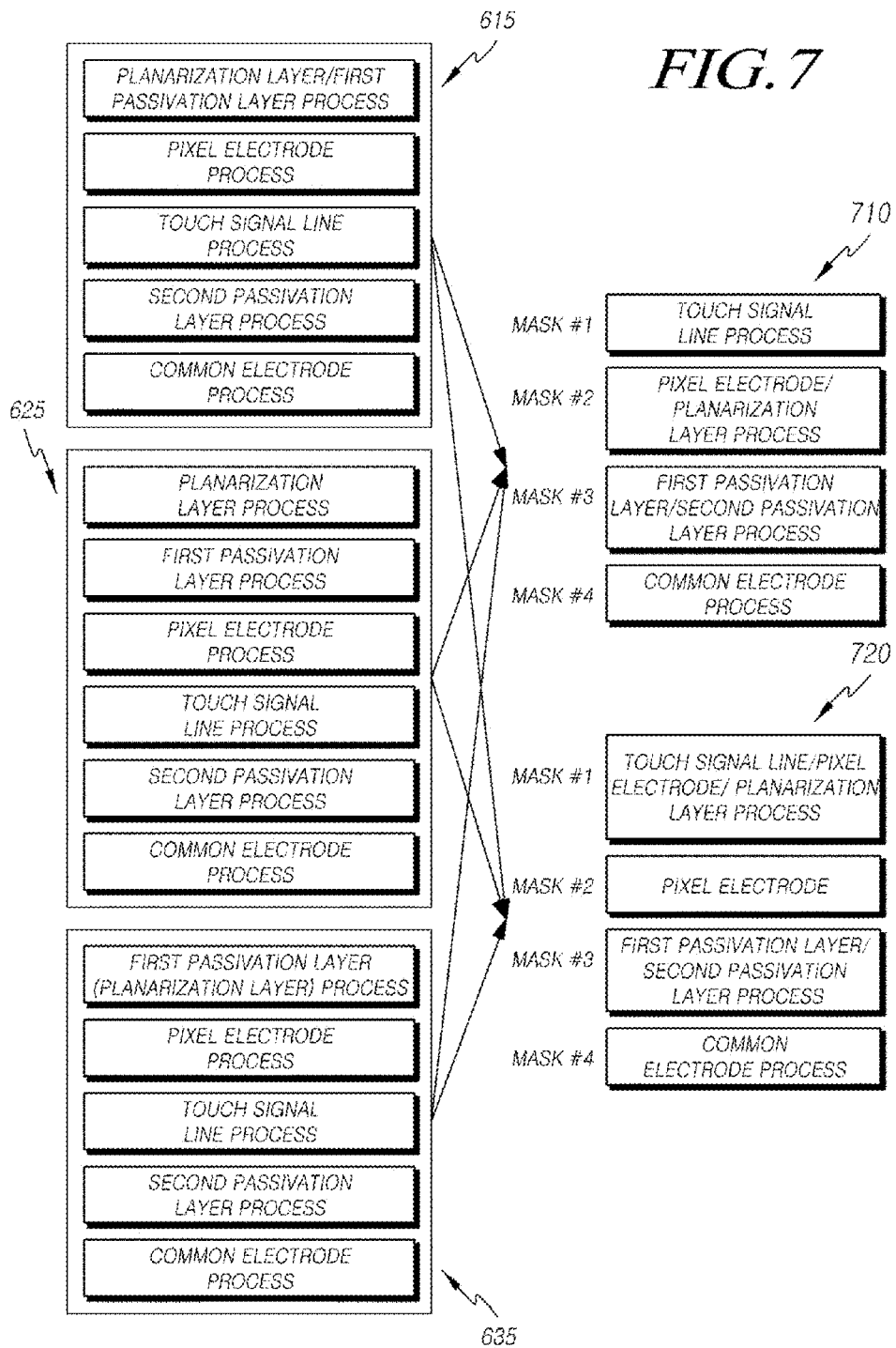
FIG. 7 is a view illustrating embodiments of two processes which are applied to a process of the present disclosure.

FIG. 7 is a view illustrating embodiments of two processes which are applied to a process of the present disclosure. Processes 615, 625 and 635 illustrated in FIG. 6 may be changed as illustrated in FIG. 7.

As indicated by reference numeral 710, a first embodiment uses mask #1 to form a touch signal line (M3L), uses mask #2 to form a pixel electrode and a planarization layer (PXL/PAC), uses mask #3 to form a first passivation layer/a second passivation layer (PAS2/PAS0), and finally uses mask #4 to form a common electrode (e.g., a Vcom electrode or a Vdd electrode). As indicated by reference numeral 720, a second embodiment uses mask #1 to form a touch signal line (M3L), and a pixel electrode and a planarization layer (PXL/PAC). The pixel electrode, which has been partially formed by using mask #1, is formed by using mask #2; mask #3 is used to form a first passivation layer/a second passivation layer (PAS2/PAS0); and finally, mask #4 is used to form a common electrode.

As a result, four process steps are performed in each of the first embodiment and the second embodiment whereas five process steps are performed in process 615, six process steps are performed in process 625, and five process steps are performed in process 635.

The structure of the in-cell type display device, which is perfected by the above-described process or a modified embodiment of the above-described process, will be summarized as follows.

Here, five to six mask processes, for each type of substrate, are applied to processes 615, 625 and 635 of forming the planarization layer (PAC) to the common electrode (COM). Hereinafter, an embodiment in which processes 615, 625 and 635 are performed by using four masks will described.

A gate line that is located in a first direction and delivers a gate signal exists on the substrate, and a data line that is located in a second direction and delivers a data signal exists on the substrate. Also, a TFT is located at each pixel defined by an intersection between one gate line and one data line among the multiple gate lines and the multiple data lines. A first electrode is spaced apart from one of a source electrode and a drain electrode of the TFT, and a second electrode is located to correspond to the first electrode. Here, the first electrode may be a pixel electrode, and the second electrode may be a common electrode to which a common voltage is applied. Further, a connection pattern is included which connects one of the source electrode and the drain electrode to the first electrode and is formed of a material identical to that of the second electrode. A process of forming the connection pattern will be described with reference to FIGS. 9A to 15C.

Here, when the display device operates in a display mode, the second electrodes may serve as common electrodes to which a common voltage is applied. When the display device operates in a touch mode, the second electrodes may serve as touch electrodes to which a touch driving signal is applied.

A third electrode layer (M3L), which delivers a touch driving signal to the second electrode, is located between a layer, in which the first electrode is generated, and a layer in which the second electrode is located. More specifically, the third electrode layer forms a touch signal line, and is located between an electrode of a material identical to that of the first electrode and an electrode of a material identical to that of the second electrode. Accordingly, the collective name for the first electrode, the second electrode and the M3L which is the third electrode layer is the "touch signal line." Alternatively, only the third electrode layer may be referred to as the "touch signal line." In process steps, discrimination may be made between a case where the first electrode, the second electrode and the M3L are called the "touch signal line" and a case where only the third electrode layer is called the "touch signal line." A structure considering this difference will be described with reference to FIG. 8, and will also be described in a process following the process of FIG. 9C.

The second electrode is an electrode to which a common voltage is applied. According to the type of display device, when the display device is a LCD device, the second electrode may be a Vcom electrode. Alternatively, when the display device is an OLED device, the second electrode may be a Vdd electrode. Accordingly, embodiments of the present disclosure may be applied to both a case where the display device is a LCD device and a case where the display device is an OLED device.

Figure 8:
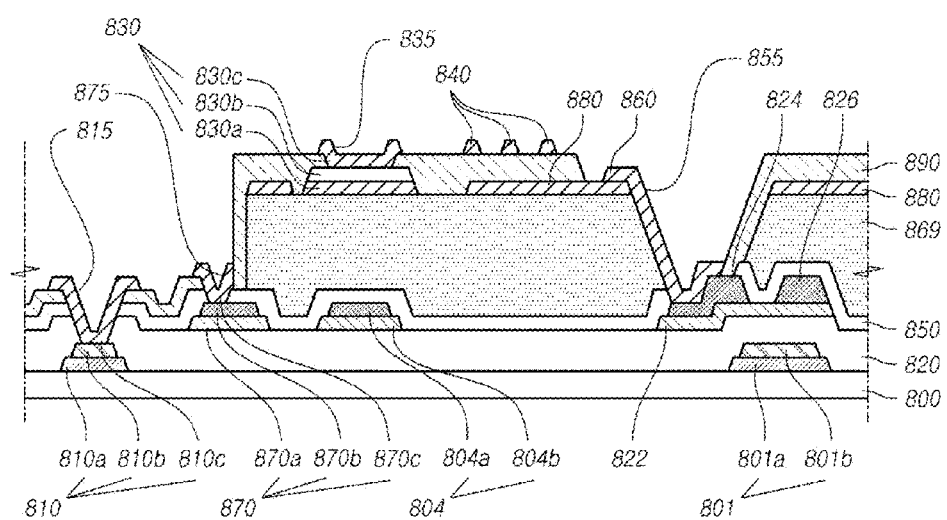
FIG. 8 is a cross-sectional view illustrating a part of a display device according to an embodiment of the present disclosure.

FIG. 8 is a cross-sectional view illustrating a pixel unit, a gate pad unit and a data pad unit of a display device according to an embodiment of the present disclosure. Referring to FIG. 8, in the pixel unit of the display device according to an embodiment of the present disclosure, a gate electrode 801 is formed on a substrate 800. The gate electrode 801 may be formed as a first double electrode 801a and a second double electrode 801b including a conductive metal layer and a transparent conductive material layer as described below. However, the gate electrode 801 is not limited thereto, and may have a single electrode structure or a multi-electrode structure. The data electrode or data line 804 may be formed as a first double electrode 804a and a second double electrode 804b including a conductive metal layer and a transparent conductive material layer.

A gate insulator 820 is formed on the gate electrode 801. An active layer 822, a source electrode 824 and a drain electrode 826 are formed on the gate insulator 820.

A first passivation layer 850 and a planarization layer 869 are sequentially formed on the source electrode 824 and the drain electrode 826. At this time, a first contact hole 855 that exposes a part of the source electrode 824 is formed in the first passivation layer 850 and the planarization layer 869.

A pixel electrode 880 having a particular pattern is formed on the planarization layer 869. Also, a touch signal line 830 including a first layer 830a and a second layer 830b is formed on the planarization layer 869. Here, the first layer 830a of the touch signal line 830 may be formed of a material identical to that of the pixel electrode 880, without being limited thereto. When the first layer 830a of the touch signal line 830 is formed of the material identical to that of the pixel electrode 880, the first layer 830a of the touch signal line 830 and the pixel electrode 880 may be formed by an identical process, without being limited thereto. Further, according to an embodiment of the present disclosure, only 830b (the third electrode layer or the M3L) representing the second layer may be referred to as the "touch signal line," without being limited thereto.

A second passivation layer 890 is formed on the pixel electrode 880 and the touch signal line 830. A second contact hole 835 is formed on the second passivation layer 890 and exposes a part of the touch signal line 830. Also, the first passivation layer 850 exposes a part of the pixel electrode 880 adjacent to the first contact hole 855. A connection pattern 860 that connects the exposed pixel electrode 880 to the source electrode 824 is formed through the first contact hole 855.

Further, common electrodes 840, electrodes 830c for touch signal line, gate pad 810c and data pad 870c having a particular pattern are formed on the first passivation layer 850. The common electrode 830c from among the common electrodes 840, 830c, gate pad 810c and data pad 870c is electrically connected to the touch signal line 830 through the second contact hole 835. Here, the common electrodes 840, 830c, gate pad 810c and data pad 870c are formed of a material identical to that of the connection pattern 860, without being limited thereto. When the common electrodes 840, 830c, gate pad 810c and data pad 870c are formed of the material identical to that of the connection pattern 860, the common electrodes 840, 830c, gate pad 810c and data pad 870c, and the connection pattern 860 are formed by an identical process, without being limited thereto.

In the gate pad unit 810, a gate line 810a and a gate line 810b are formed on the substrate 800. The gate insulator 820, the first passivation layer 850 and the second passivation layer 890 are formed on the gate line 810a and the gate line 810b. A third contact hole 815 is formed in the gate insulator 820, the first passivation layer 850, and the second passivation layer 890, and exposes a part of the gate line 810b. A gate pad 810c is formed on the second passivation layer 890 and the exposed part of the gate line 810b.

In the data pad unit 870, the gate insulator 820 is formed on the substrate 800. A data line 870a and a data line 870b are formed on the gate insulator 820. The first passivation layer 850 and the second passivation layer 890 are formed on the data line 870a and the data line 870b. A fourth contact hole 875 is formed in the first passivation layer 850 and the second passivation layer 890, and exposes a part of the data line 870b. A data pad 870c is formed on the second passivation layer 890 and the exposed part of the data line 870b.

FIG. 8 illustrates the configuration corresponding to one pixel. When the configuration illustrated in FIG. 8 is extended to the entire display device, the extended configuration may be applied to the display device illustrated in FIG. 1.

Specifically, the display panel 110 includes a gate line that is located in the first direction on the substrate and delivers a gate signal; a data line that is located in the second direction on the substrate and delivers a data signal; a TFT located at each intersection between the gate line and the data line; a first electrode that is connected to one of a source electrode and a drain electrode of the TFT; and a connection pattern that connects a second electrode, which is located on the first electrode, to the first electrode, which is connected to one of the source electrode and the drain electrode, and is formed of a material identical to that of the second electrode.

Also, when the driving mode of the display panel 110 is a touch driving mode, the touch IC 140 applies a touch driving signal to all or some of the multiple second electrodes. When the driving mode of the display panel 110 is a display driving mode, the data driver 120 supplies a data voltage to the multiple data lines.

When the driving mode of the display panel 110 is the display driving mode, the gate driver 130 sequentially provides a scan signal to the multiple gate lines. When the driving mode of the display panel 110 is the touch driving mode, a touch driving signal or a signal, which corresponds to the touch driving signal, is applied to all or some of the multiple gate lines.

The first embodiment and the second embodiment, which correspond to processes of forming the connection pattern 860 illustrated in FIG. 8 and reducing the number of masks, will be described below.

The first embodiment which will be described in more detail is as illustrated in FIGS. 9A to 12C.

FIGS. 9A to 9E are process diagrams illustrating processes of stacking and forming a TFT, a first passivation layer, a planarization layer, a pixel electrode, and a touch signal line according to the first embodiment and the second embodiment of the present disclosure.

Figure 9A:
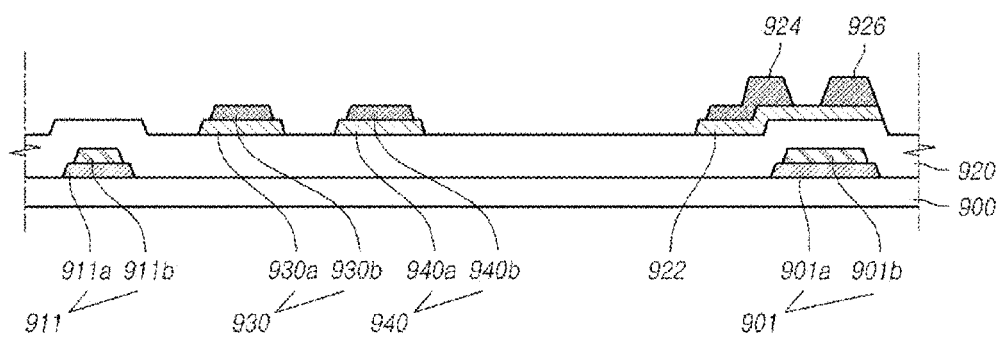
FIGS. 9A to 9E are process diagrams illustrating processes of stacking and forming a thin film transistor, a first passivation layer, a planarization layer, a pixel electrode, and a touch signal line according to a first embodiment and a second embodiment of the present disclosure.

Referring to FIG. 9A, a gate electrode 901 is formed in the form of a first gate double electrode 901a and a second gate double electrode 901b on a substrate 900, and a gate line 911 for contacting a gate pad is also formed in the form of a first gate line double electrode 911a and second gate line double electrode 911b in this process.

The one parts 901a and 911a of the double electrodes formed as the gate electrode 901 and the gate line 911 for contacting the gate pad are both a conductive metal layer, and may be formed of at least one selected from the conductive metal group consisting of aluminum (Al), tungsten (W), copper (Cu), molybdenum (Mo), chromium (Cr), titanium (Ti), molybdenum-tungsten (MoW), molybdenum-titanium (MoTi), and copper/molybdenum titanium (Cu/MoTi), without being limited thereto. Also, the other parts 901b and 911b of the double electrodes formed as the gate electrode 901 and the gate line 911 for contacting the gate pad are both a transparent conductive material layer, and may be formed of one selected from the group consisting of Indium Tin Oxide (ITO), Indium Zinc Oxide (IZO), and Carbon Nano Tube (CNT), without being limited thereto. Further, as described above, each of the gate electrode 901 and the gate line 911 for contacting the gate pad is not limited to the formation in the form of a double electrode, and thus may be formed in the form of a single electrode rather than a double electrode.

One mask may be used in a process of forming the gate electrode 901 and the gate line 911 for contacting the gate pad. A gate insulator 920 is formed on the gate electrode 901 and the gate line 911 for contacting the gate pad.

An active layer 922, a source electrode 924 and a drain electrode 926 are formed on the gate insulator 920. In this process, a data line 930 for contacting the data pad and a data line 940 are formed together. Similarly, one mask may be used during this process.

More specifically, the active layer 922 may be formed of, for example, a semiconductor material such as amorphous silicon, or poly-silicon such as LTPS or HTPS. Alternatively, the active layer 922 may be formed of an oxide semiconductor material, such as Zinc Oxide (ZO), Indium Galiumzinc Oxide (IGZO), Zinc Indium Oxide (ZIO), or Ga-doped ZnO (ZGO).

Then, a TFT is completed by simultaneously forming the source electrode 924 and the drain electrode 926 by using a thin film formation process of deposition, such as sputtering, or the like.

Figure 9B:
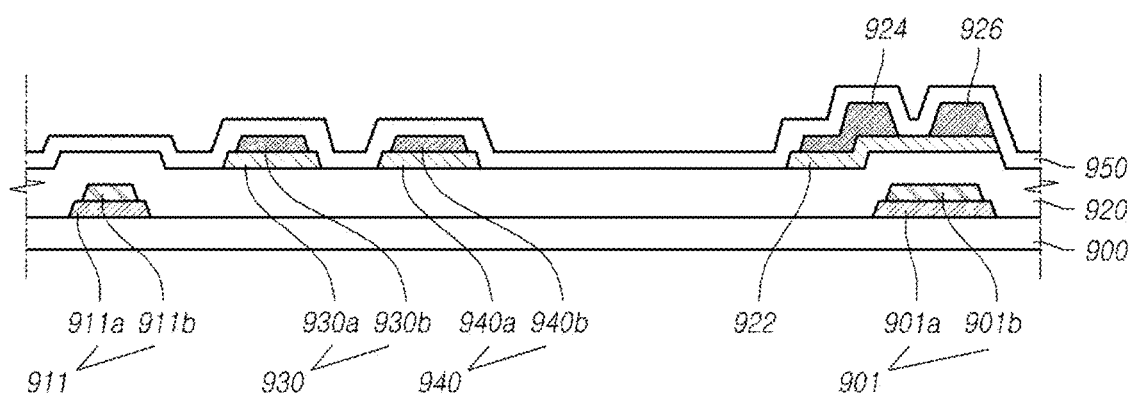

Referring to FIG. 9B, a first passivation layer 950 is formed on the substrate having the TFT formed thereon. The first passivation layer 950 may be formed of an inorganic material such as silicon dioxide SiO2 or silicon nitride SiNx, or an organic material such as photo acryl (PA) or the like. However, the present disclosure is not limited thereto.

Figure 9C:
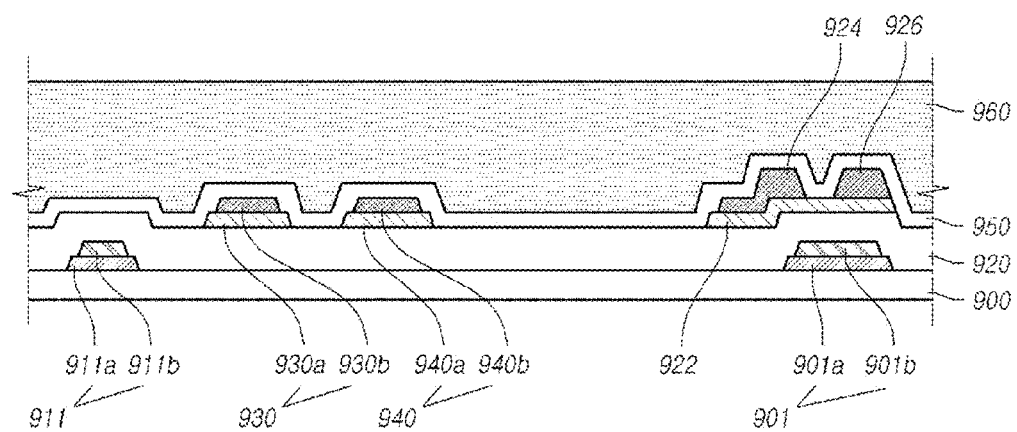

Referring to FIG. 9C, a planarization layer 960 is formed on the first passivation layer 950. The planarization layer 960 has a permittivity ranging from several tens to several hundreds, and may be formed of light rare earth oxide such as lanthanum aluminate LaAlO3, lanthanum oxide La2O3, yttrium oxide Y2O3 or LaAl3O6, rare earth complex oxide, barium strontium titanate (BST) oxide, or the like. However, the present disclosure is not limited thereto. The planarization layer 960 compensates for a step difference between electrodes, and planarization is achieved between the electrodes.

Figure 9D:
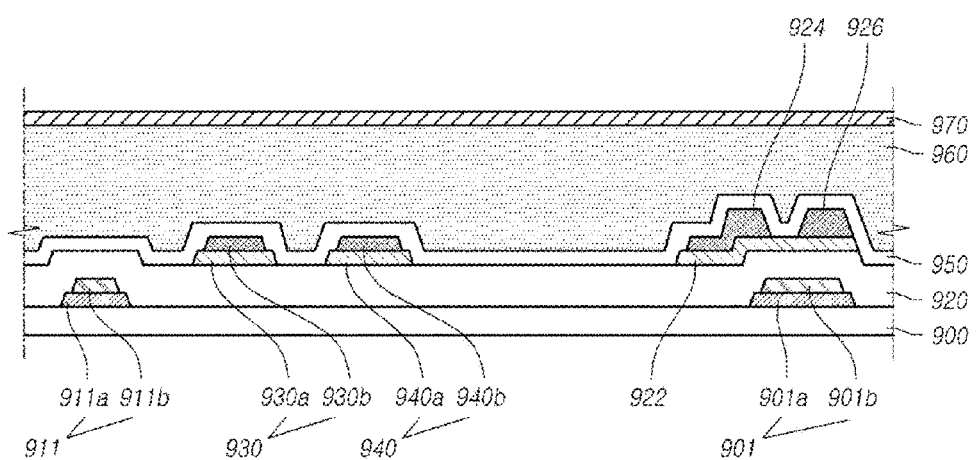

Referring to FIG. 9D, a pixel electrode 970 is formed on the planarization layer 960. The pixel electrode 970 is formed of a transparent conductive material, and may be formed of, for example, Indium Tin Oxide (ITO), Indium Zinc Oxide (IZO), or Indium Tin Zinc Oxide (ITZO), as described above. The pixel electrode 970 is connected to the source electrode 924 or the drain electrode 926 through a subsequent process.

Figure 9E:
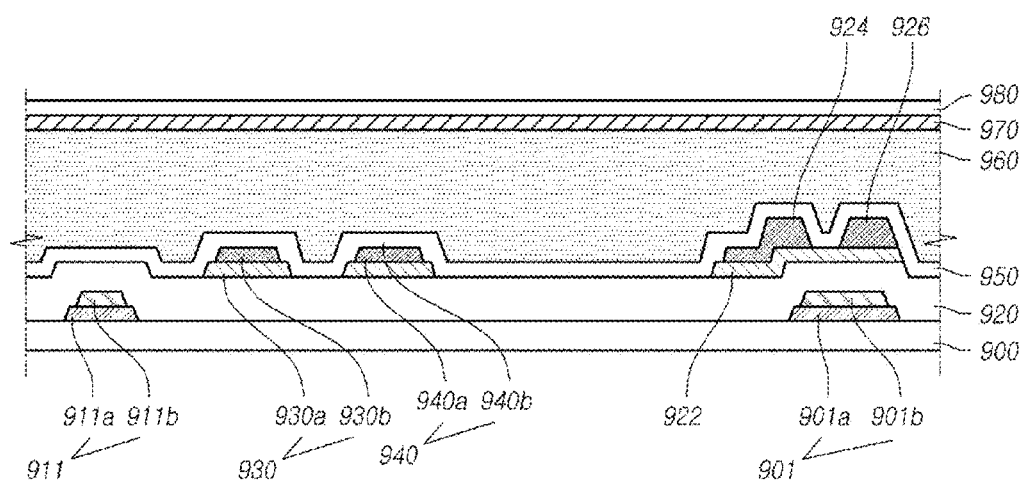

Referring to FIG. 9E, a touch signal line 980 is formed on the pixel electrode 970. The touch signal line 980 is etched by a subsequent process, and thereby delivers a touch driving signal.

In order to form a relevant photoresist as a first step of a photolithography process, a photoresist may be first coated, light may be irradiated onto a mask after the mask including a light-transmitting portion and a light-shielding portion is covered on the photoresist, and thereby a photoresist pattern (e.g., indicated by reference numeral 1090 in FIG. 10A or reference numeral 1110 in FIG. 11A) may be formed to have a particular desired pattern. Light which has transmitted the light-transmitting portion hardens the photoresist, and the remaining photoresist may be developed or may be not developed.

Figure 10A:
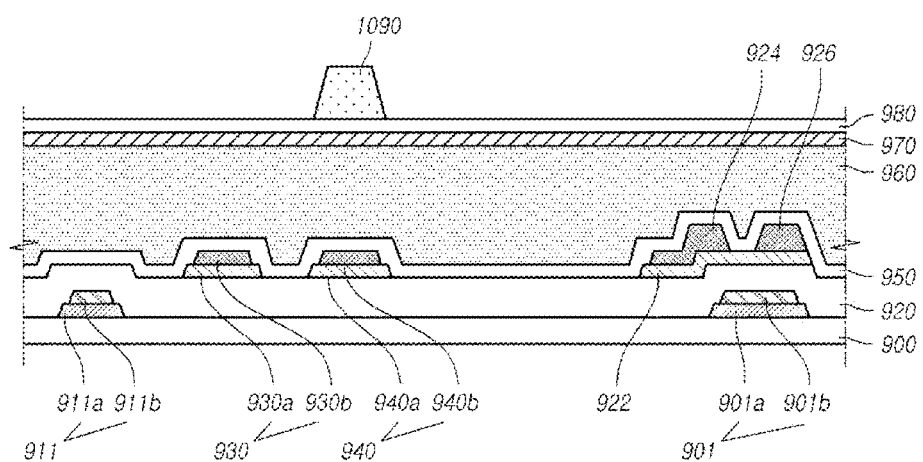
FIGS. 10A to 10C are process diagrams illustrating a process of forming a touch signal line by using a mask according to a first embodiment of the present disclosure.
Figure 10B:
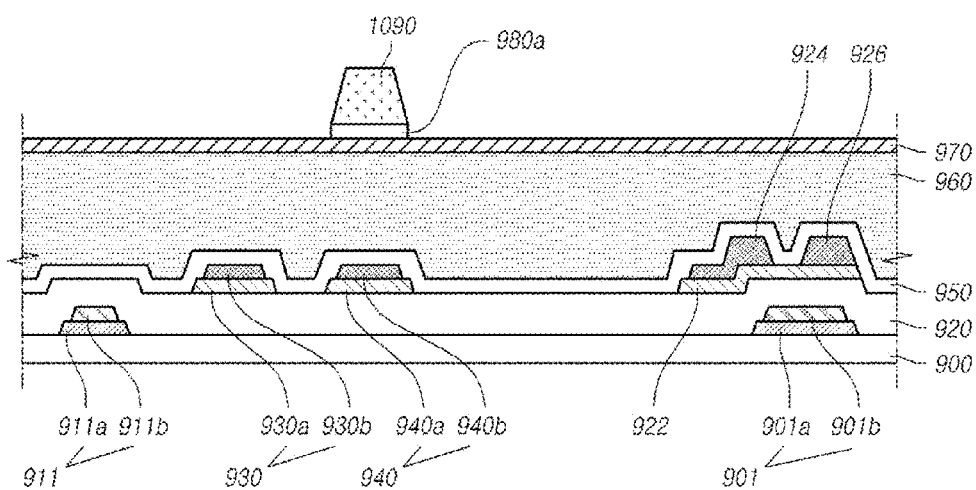
Figure 10C:
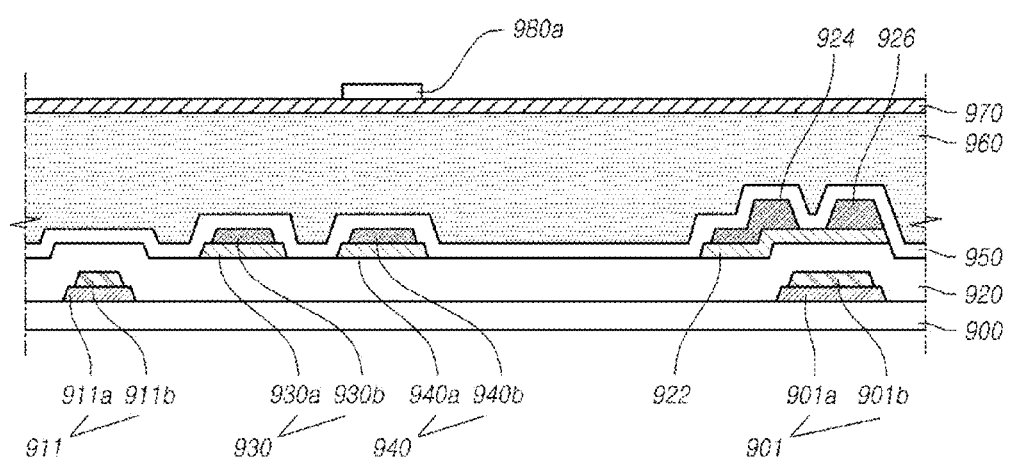

FIGS. 10A to 10C are process diagrams illustrating a process of forming a touch signal line by using a mask according to the first embodiment of the present disclosure.

Referring to FIG. 10A, in order to form the touch signal line 980, the photoresist 1090 having a particular pattern is formed by using a mask (e.g., mask #1 in process 710).

Referring to FIG. 10B, a touch signal line 980a is formed by etching the touch signal line 980 by using the photoresist 1090.

Referring to FIG. 10C, the touch signal line 980a having a particular pattern is completed by removing the photoresist 1090.

In this regard, in the case of Vcom On Top (VOT) to which a planarization layer is applied, the process illustrated FIGS. 10A to 10C may be omitted.

FIGS. 11A to 11E are process diagrams illustrating a process of etching a pixel electrode and a planarization layer according to the first embodiment of the present disclosure using a second mask (e.g., mask #2 in process 710).

Figure 11A:
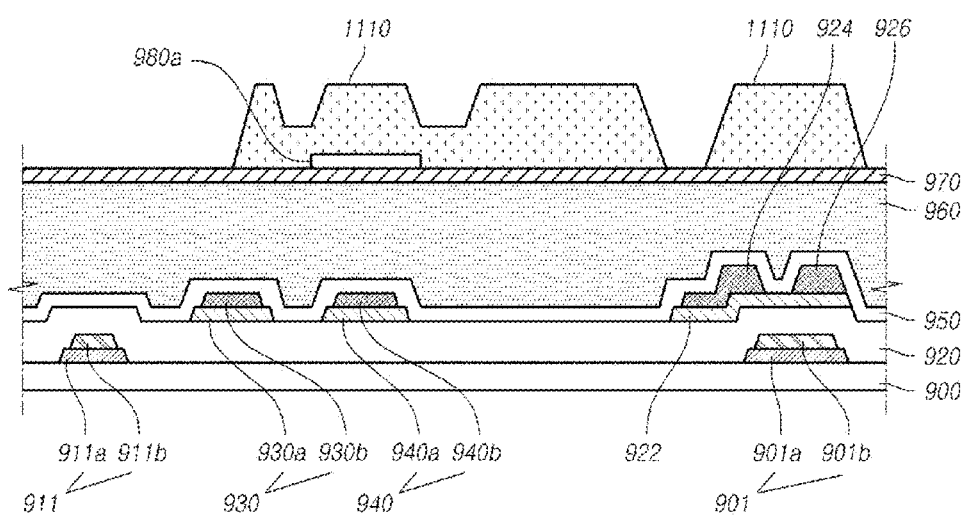
FIGS. 11A to 11E are process diagrams illustrating a process of etching a pixel electrode and a planarization layer according to a first embodiment of the present disclosure.

Referring to FIG. 11A, a photoresist 1110 having three heights is formed by using a halftone mask, a diffraction mask, or the like.

Figure 11B:
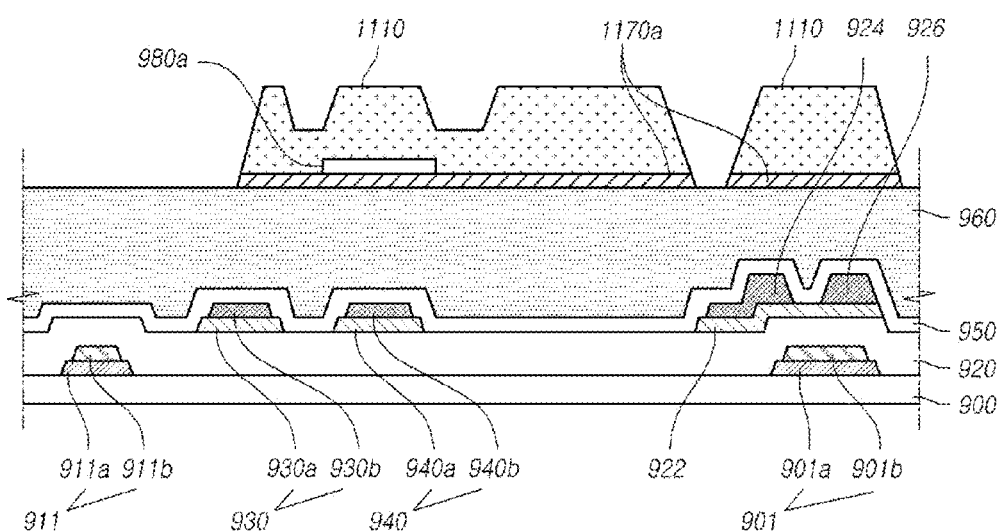

Referring to FIG. 11B, a pixel electrode 1170a having a particular pattern is formed by etching a part of the pixel electrode 970 in such a manner as to perform wet etching by using the photoresist 1110.

Figure 11C:
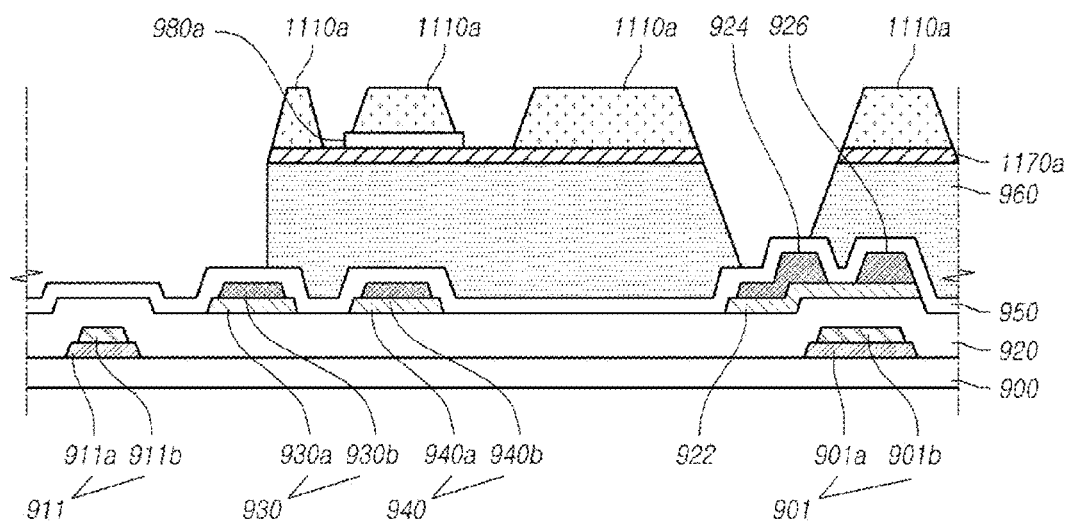

Referring to FIG. 11C, the structure is formed by etching a part of the planarization layer 960 in such a manner as to perform dry etching by using the photoresist 1110. The photoresist 1110a is a residue of the photoresist 1110 illustrated in FIG. 11B which has been etched.

Figure 11D:
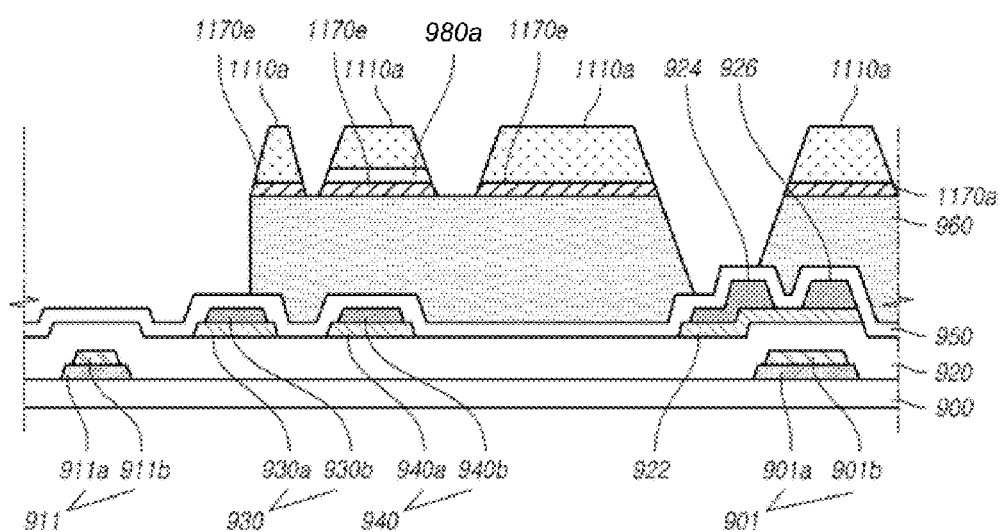

Referring to FIG. 11D, a pixel electrode 1170e having a particular pattern is formed by additionally etching a part of the pixel electrode 1170a in such a manner as to perform the second wet etching on the photoresist 1110a illustrated in FIG. 11C.

Figure 11E:
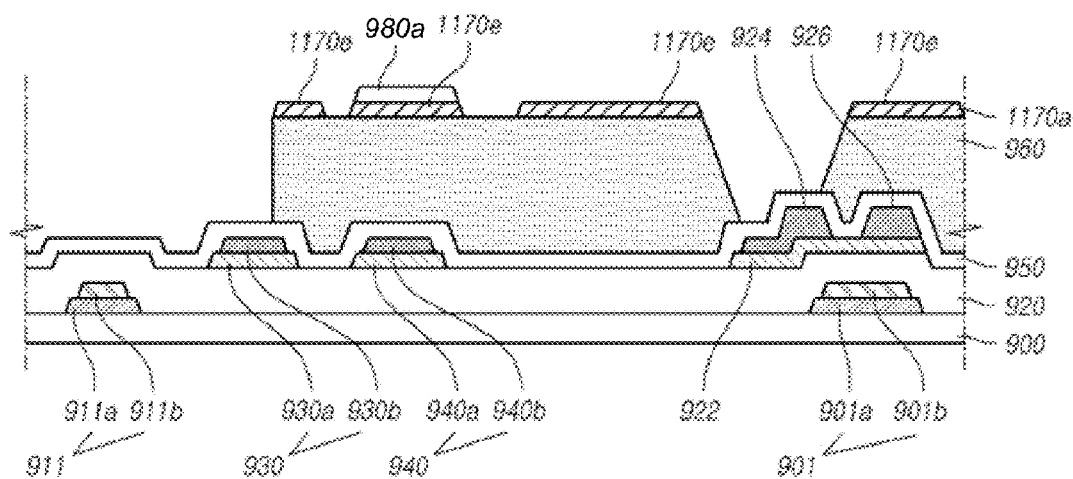

In FIG. 11e, the photoresist 1110a is removed from the structure illustrated in FIG. 11D.

Figure 12A:
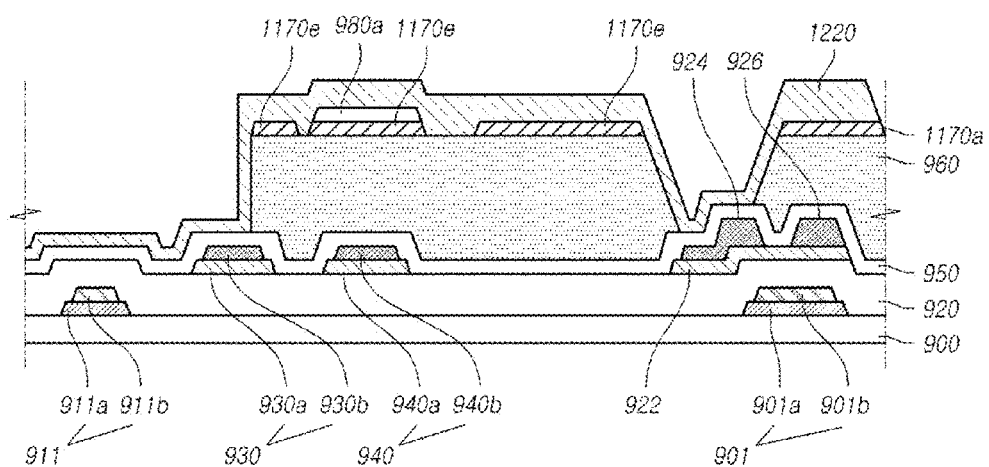
FIGS. 12A to 12C are process diagrams illustrating a process of forming a second passivation layer, a process of forming a common electrode, and a process of forming a contact between a pixel electrode and source/drain according to a first embodiment of the present disclosure.
Figure 12B:
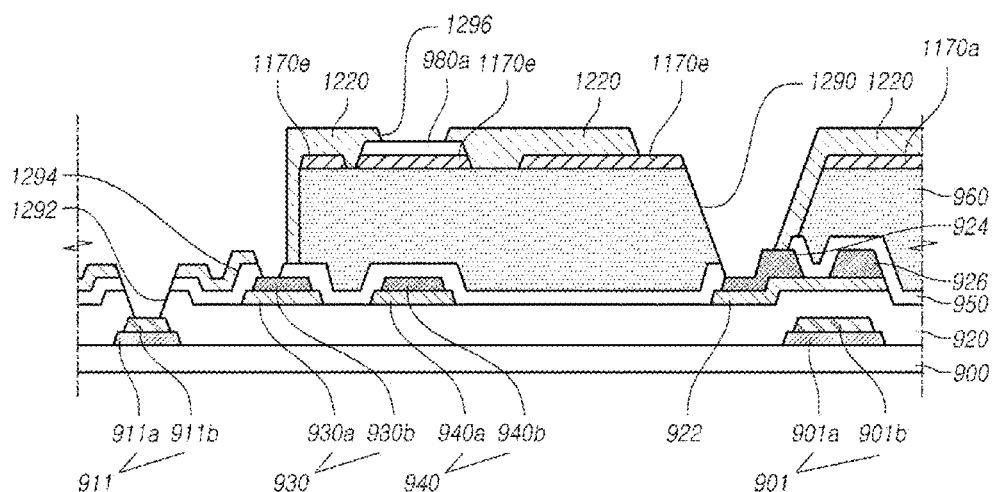
Figure 12C:
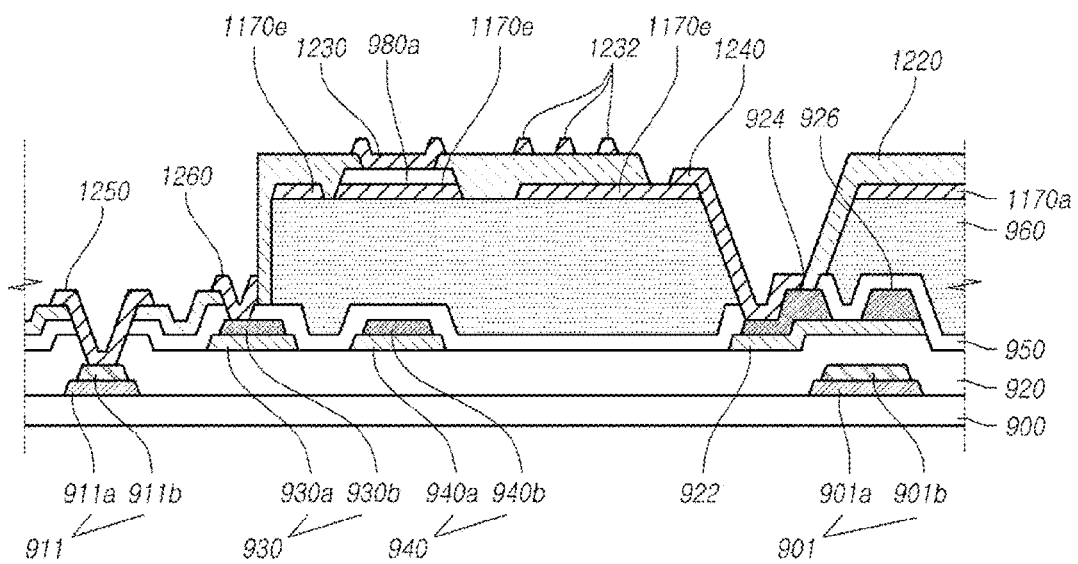

FIGS. 12A to 12C are process diagrams illustrating a process of forming a second passivation layer (e.g., using mask #3 in process 710), a process of forming a common electrode (e.g., using mask #4 in process 710), and a process of forming a contact between a pixel electrode and source/drain according to the first embodiment of the present disclosure.

Referring to FIG. 12A, a second passivation layer 1220 is formed on the substrate 900, on which the pixel electrode 1170e having the particular pattern has been formed.

Referring to FIG. 12B, the structure is formed by dry-etching the second passivation layer 1220 and the first passivation layer 950 by using a mask (e.g., mask #3 in process 710).

In FIG. 12B, a contact hole 1292 that exposes a part of the gate line 911 is formed by etching the gate insulator 920 located on the gate line 911 for contacting the gate pad, and a contact hole 1290 that exposes a part of the source electrode 924 is formed.

At this time, a part of the first passivation layer 950 on the data line 930 for contacting the data pad is also etched, and thereby a contact hole 1294 is formed. Further, a contact hole 1296 that exposes a part of the touch signal line 980a is formed. The etched second passivation layer 1220 exposes a part of the pixel electrode 1170e.

Referring to FIG. 12C, a common electrode 1232 is formed on the second passivation layer 1220 by applying a material, which is required to form a common electrode, by using a mask (e.g., mask #4 in process 710). In this process, a part 1230 of the material is formed on the touch signal line 980a. In this process, a connection pattern 1240 is formed on the contact hole 1290 at FIG. 12B, the connection pattern 1240 connects the pixel electrode 1170e and the source electrode 924 which are exposed as illustrated in FIG. 12B. Then, during a process identical to that of forming the common electrode, a gate pad cover 1250 and a data pad cover 1260 are formed on the exposed gate line 911 for contacting the gate pad and the exposed data line 930 for contacting the data pad.

A process of stacking and forming a TFT, a first passivation layer, a planarization layer, a pixel electrode and a touch signal line in the second embodiment is identical to the process described with reference to FIGS. 9A to 9E. A subsequent process is as illustrated in FIG. 13A.

FIGS. 13A to 13E are process diagrams illustrating a process of forming a touch signal line and a pixel electrode, and a planarization layer through etching according to the second embodiment of the present disclosure (e.g., using mask #1 in process 720).

Figure 13A:
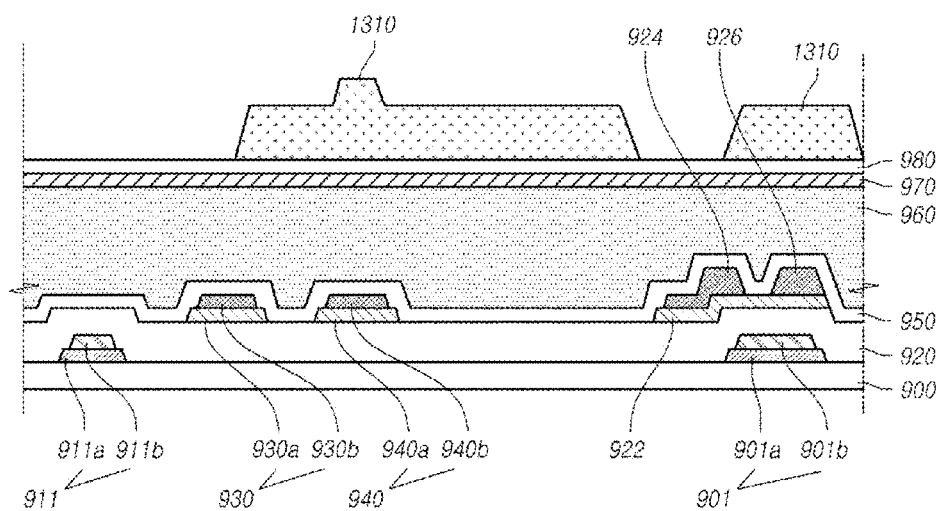
FIGS. 13A to 13E are process diagrams illustrating a process of forming a touch signal line and a pixel electrode, and a planarization layer through etching according to a second embodiment of the present disclosure.

Referring to FIG. 13A, with respect to the substrate illustrated in FIG. 9E, a photoresist 1310 having three heights is formed by using a halftone mask, a diffraction mask, or the like.

Figure 13B:
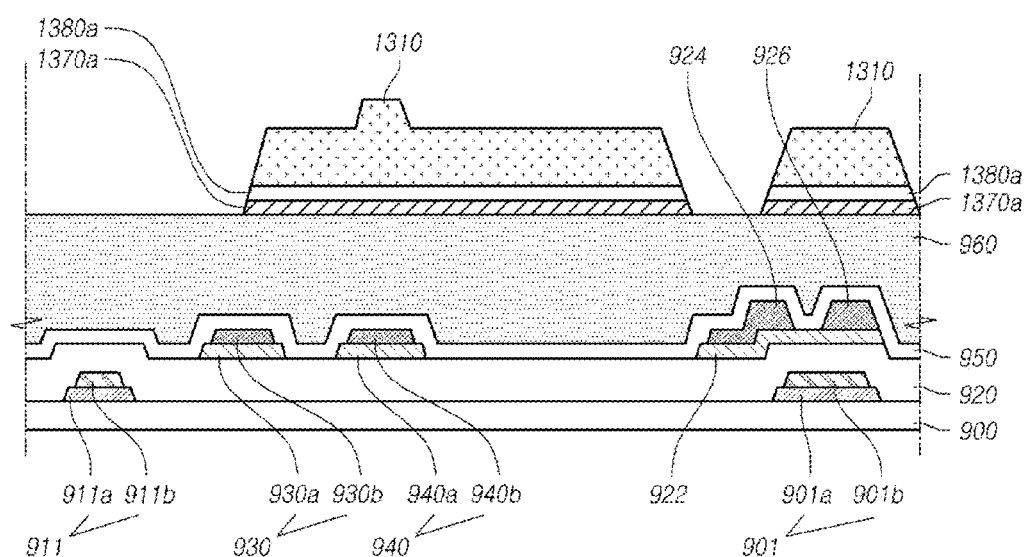

Referring to FIG. 13B, in such a manner as to perform wet-etching, a touch signal line 1380a having a particular pattern is formed by etching a part of the touch signal line 980 illustrated in FIG. 9E, and a pixel electrode 1370a having a particular pattern is formed from the pixel electrode 970 illustrated in FIG. 9E.

Figure 13C:
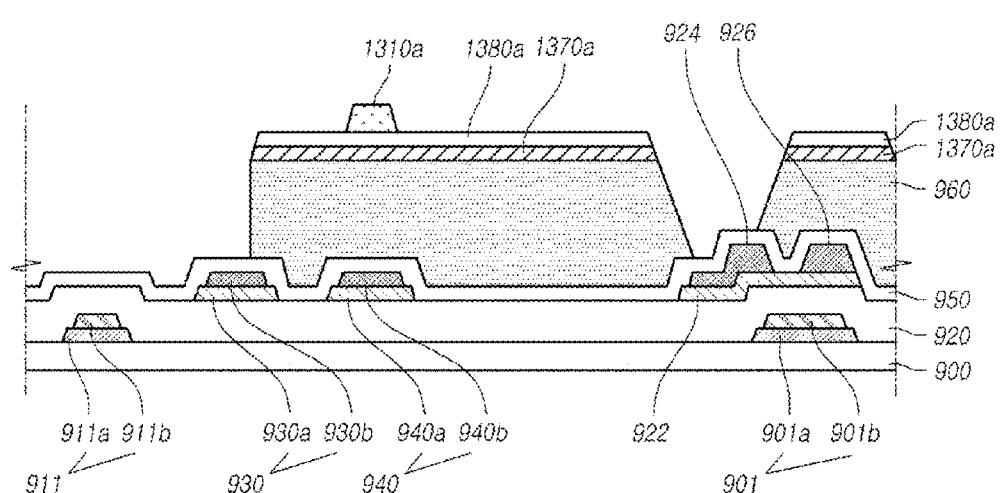

Referring to FIG. 13C, the structure is formed by dry-etching a part of the planarization layer 960. A photoresist 1310a is a residue of the etched photoresist 1310 of FIG. 13B.

Figure 13D:
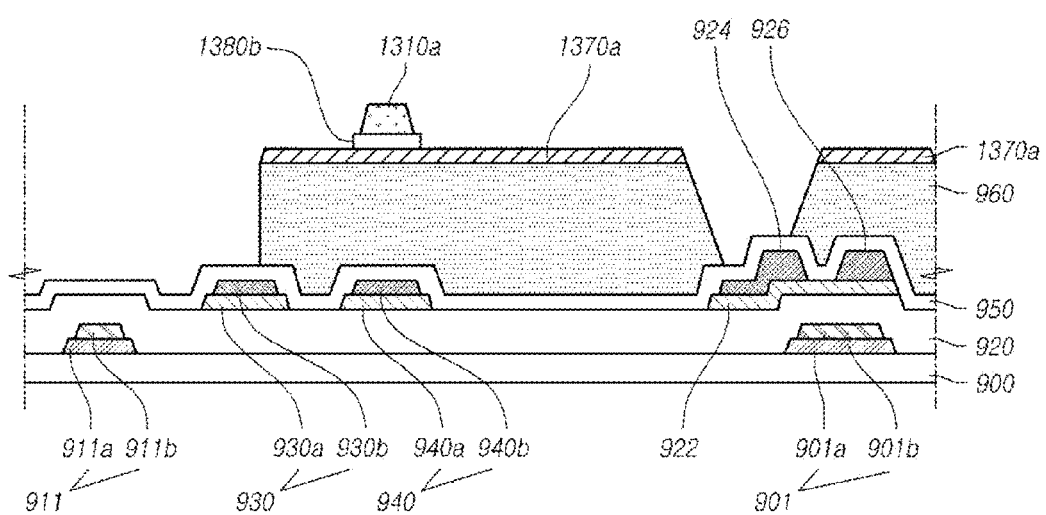

Referring to FIG. 13D, a touch signal line 1380b having a predetermined pattern is formed by removing and etching a part of the touch signal line 1380a illustrated in FIG. 13C in such a manner as to perform dry etching.

Figure 13E:
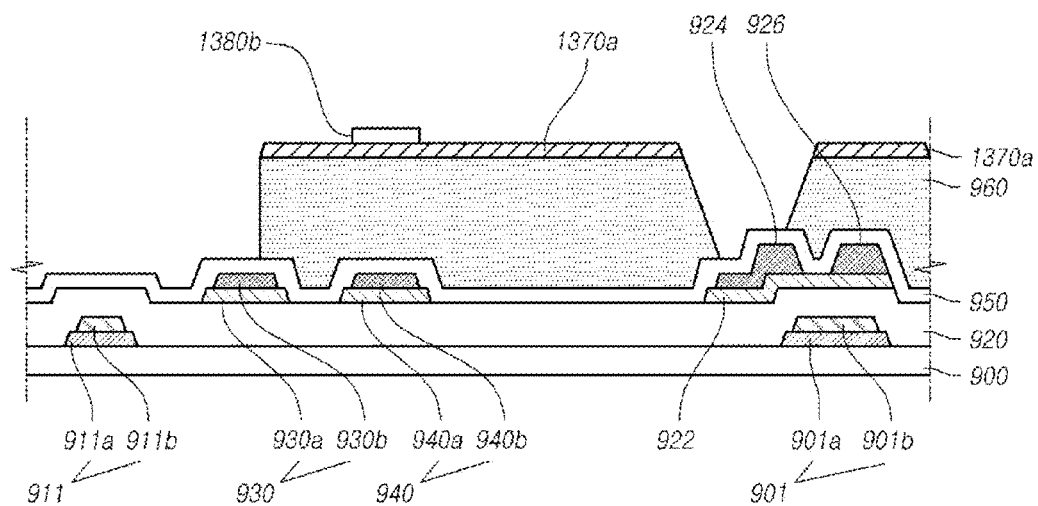

Referring to FIG. 13E, the photoresist 1310a is removed from the structure illustrated in FIG. 13D.

Figure 14A:
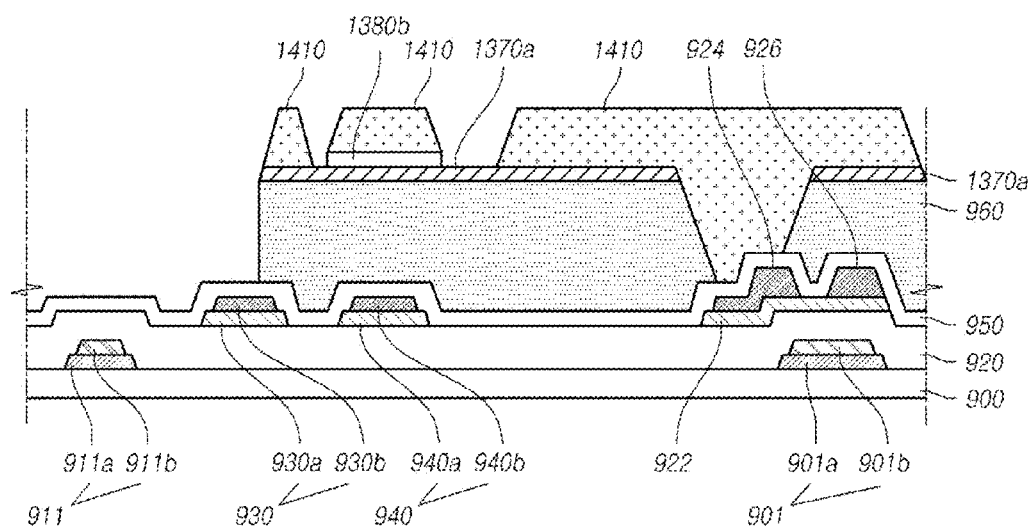
FIGS. 14A to 14C are process diagrams illustrating a process of etching a pixel electrode according to a second embodiment of the present disclosure.
Figure 14B:
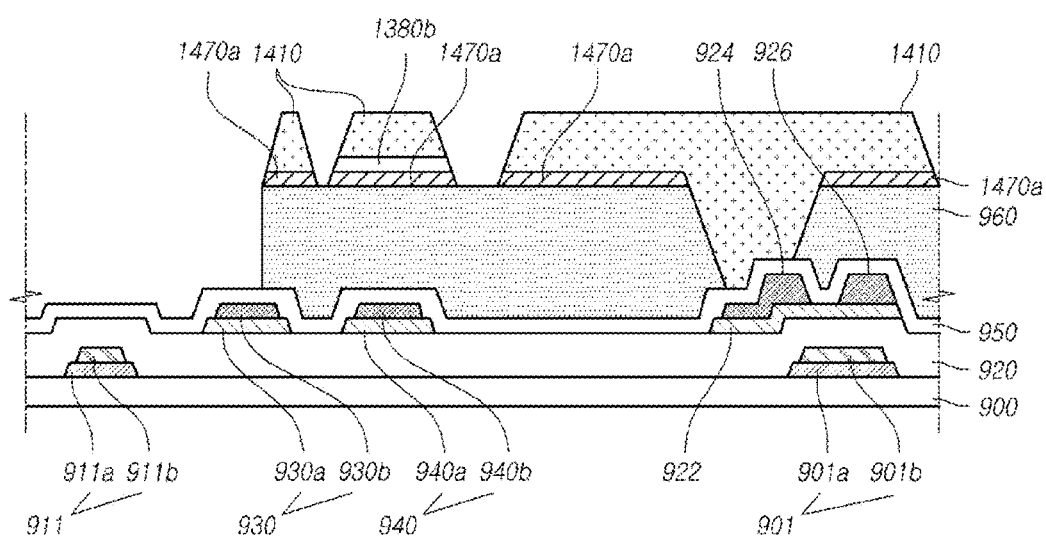
Figure 14C:
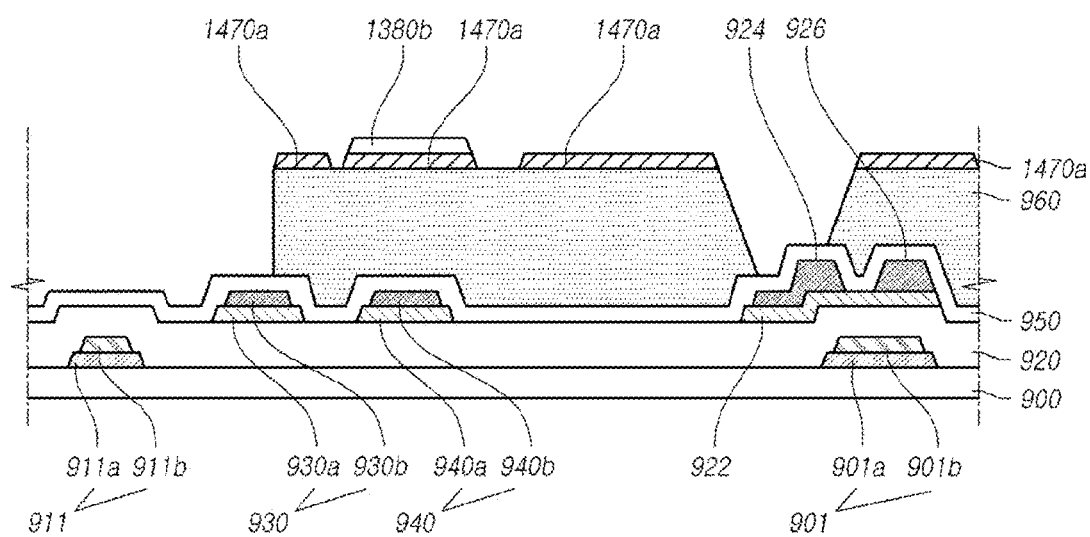

FIGS. 14A to 14C are process diagrams illustrating a process of etching a pixel electrode according to the second embodiment of the present disclosure (e.g., using mask #2 of process 720).

Referring to FIG. 14A, a photoresist 1410 is formed by using a mask in order to etch the pixel electrode 1370a illustrated in FIG. 13E (e.g., using mask #2 of process 720).

Referring to FIG. 14B, wet etching is performed and thereby a pixel electrode 1470a having a particular pattern is formed from the pixel electrode 1370a of FIG. 14A located beneath the touch signal line 1380b.

Referring to FIG. 14C, the photoresist 1410 is removed from the structure illustrated in FIG. 14B.

Figure 15A:
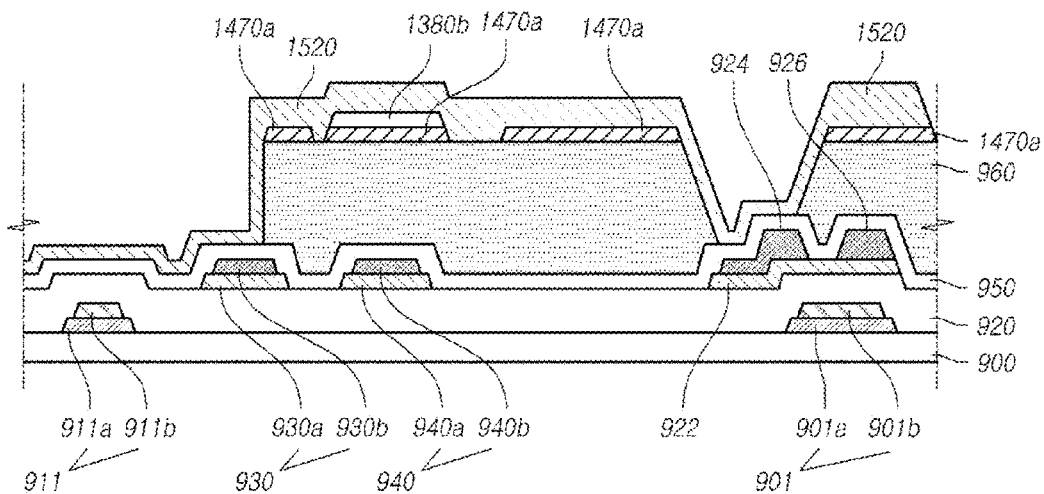
FIGS. 15A to 15C are process diagrams illustrating a process of forming a second passivation layer, a process of forming a common electrode, and a process of forming a contact between a pixel electrode and a source or drain according to a second embodiment of the present disclosure.
Figure 15B:
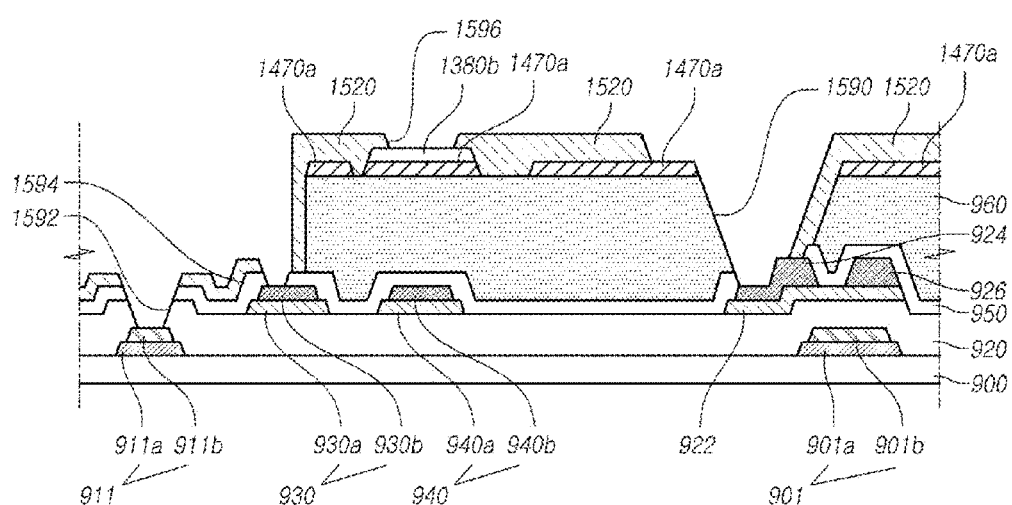
Figure 15C:
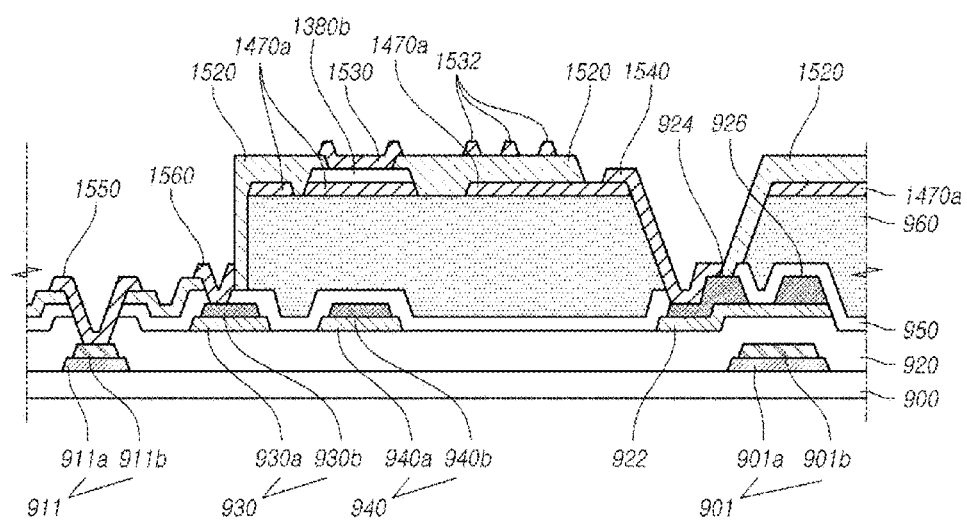

FIGS. 15A to 15C are process diagrams illustrating a process of forming a second passivation layer (e.g., using mask #3 of process 720), a process of forming a common electrode (e.g., using mask #4 of process 720), and a process of forming a contact between a pixel electrode and source/drain according to the second embodiment of the present invention.

Referring to FIG. 15A, a second passivation layer 1520 is formed on the substrate 900, on which the pixel electrode 1470a having the particular pattern has been formed.

Referring to FIG. 15B, the structure is formed by dry-etching the second passivation layer 1520 and the first passivation layer 950 by using a mask (e.g., using mask #3 of process 720). Here, a contact hole 1592 that exposes a part of the gate line 911 is formed by etching the gate insulator 920 located on the gate line 911 for contacting the gate pad, and a contact hole 1590 that exposes a part of the source electrode 924 is formed.

At this time, a part of the first passivation layer 950 on the data line 930 for contacting the data pad is also etched, and thereby a contact hole 1594 is formed. Further, a contact hole 1596 that exposes a part of the touch signal line 980a is formed. The etched second passivation layer 1520 exposes a part of the pixel electrode 1470e.

Referring to FIG. 15C, a common electrode 1532 is formed on the second passivation layer 1520 by applying a material, which is required to form a common electrode, by using a mask (e.g., using mask #4 of process 720). In this process, a part 1530 of the common electrode is formed on the touch signal line 1380b. Also, a connection pattern 1540 is formed on the contact hole 1290 in such a manner that the part 1530 of the common electrode connects the pixel electrode 1470a and the source electrode 924 which are exposed as illustrated in FIG. 15B. Then, during a process identical to that of forming the common electrode, elements indicated by reference numerals 1550 and 1560 are formed on the exposed gate line 911 and the exposed data line 930.

The processes according to the first embodiment and the second embodiment will be summarized below.

As illustrated in FIG. 9A, a TFT is formed on the substrate. Then, as illustrated in FIGS. 9B to 9E, a first passivation layer that covers the TFT, a planarization layer, a first electrode layer, and a third electrode layer that applies a touch driving signal are stacked. Then, a third electrode and a first electrode are formed by etching the third electrode layer, the first electrode layer and the planarization layer by using a first photomask and a second photomask. These processes have been described in the first embodiment of FIG. 10A to FIG. 11E and the second embodiment of FIG. 13A to FIG. 14C.

Then, a second passivation layer is applied; a part of a source electrode or a drain electrode is exposed by etching the first passivation layer and the second passivation layer by using a third photomask; and a connection pattern, which connects the first electrode to the exposed part of the source electrode or the drain electrode, and a second electrode are formed by using a fourth photomask. These process steps have been described with reference to FIGS. 12A to 12C and FIGS. 15A to 15C.

According to the first embodiment, in the step of forming the third electrode and the first electrode by etching the third electrode layer, the first electrode layer and the planarization layer, the third electrode may be formed by using the first photomask, and the first electrode and the planarization layer may be simultaneously formed by using the second photomask.

According to the second embodiment, in the step of forming the third electrode and the first electrode by etching the third electrode layer, the first electrode layer and the planarization layer, the third electrode layer, the first electrode layer and the planarization layer may be formed by using the first photomask, the third electrode may be formed by using the remaining first photomask, and then the first electrode may be formed by using the second photomask.

Also, as illustrated in FIG. 12B and FIG. 15B, in the process of exposing the part of the source electrode or the drain electrode, a part of a gate pad electrode and a data pad electrode may be simultaneously exposed.

When the first embodiment of FIG. 9A to FIG. 12C or the second embodiment of FIGS. 9A to 9E and FIG. 13A to FIG. 15C are applied, in the process of forming a common electrode, a connection pattern may be formed to allow a pixel electrode to contact a source electrode or a drain electrode. As a result, the number of masks in the process steps can be reduced.

As well as in the above-described process steps in a case where an active layer of a TFT is formed of amorphous silicon, even when the active layer of the TFT is formed of a metal-oxide semiconductor or poly-silicon (e.g., LTPS), a connection pattern may be implemented which connects a pixel electrode to a source electrode or a drain electrode according to an embodiment of the present disclosure. Process steps 625 in FIG. 7 of the process, in which an active layer of a TFT is formed of a metal semiconductor, may be applied together with process 710 or 720 according to an embodiment of the present disclosure. Similarly, process steps 635 in FIG. 7 of the LTPS process may be applied together with process 710 or 720 according to an embodiment of the present disclosure.

Figure 16:
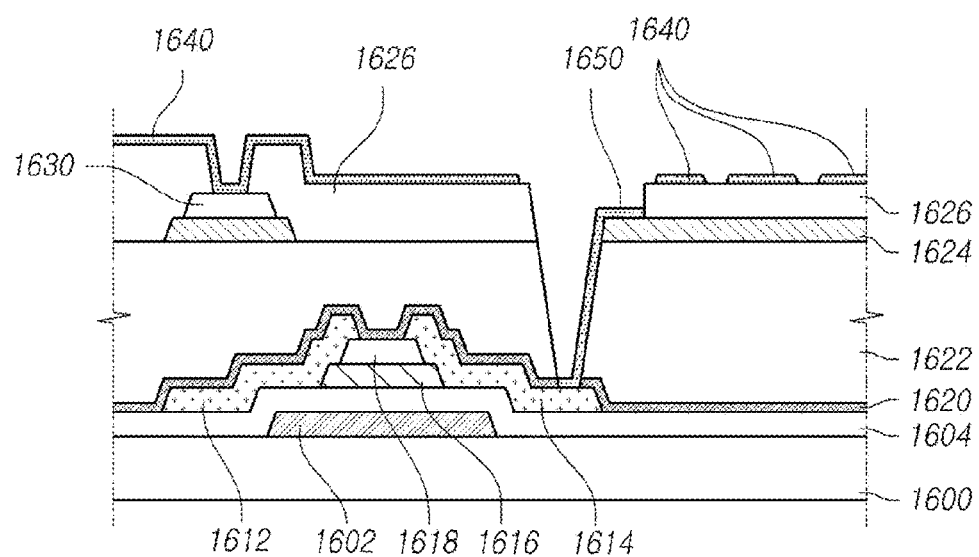
FIG. 16 is a cross-sectional view illustrating an embodiment of the present invention applied to a case where an active layer of a thin film transistor is formed of a metal-oxide semiconductor according to one embodiment.

FIG. 16 is a cross-sectional view illustrating an embodiment of the present disclosure applied to a case where an active layer of a TFT is formed of a metal-oxide semiconductor.

FIG. 16 is a cross-sectional view illustrating a connection pattern between a pixel electrode and a source electrode or a drain electrode in a case to which the process indicated by reference numeral 710 or 720 is applied.

Referring to FIG. 16, formed are a substrate 1600, a gate 1602, a gate insulating film 1604, a source electrode 1612, a drain electrode 1614, an active layer 1616, an etching stopper layer 1618, a first passivation layer 1620, a planarization layer 1622, a pixel electrode 1624, a second passivation layer 1626, a touch signal line (e.g., a third electrode layer or an M3L) 1630, and a common electrode 1640. Also, a connection pattern 1650 is formed which connects the pixel electrode 1624 to the drain electrode 1614. The common electrode 1640 and the connection pattern 1650 are both formed of an identical material in one process step.

Figure 17:
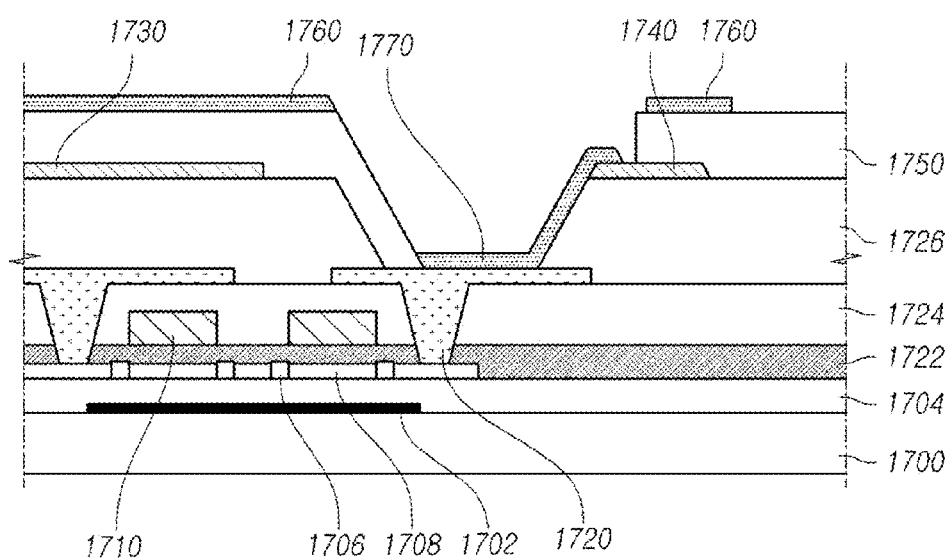
FIG. 17 is a cross-sectional view illustrating an embodiment of the present invention applied to a case where an active layer of a thin film transistor is formed of low temperature poly-silicon according to one embodiment.

FIG. 17 is a cross-sectional view illustrating an embodiment of the present disclosure applied to a case where an active layer of a TFT is formed of low temperature poly-silicon.

FIG. 17 is a cross-sectional view illustrating a connection pattern between a pixel electrode and a source electrode or a drain electrode in a case to which the process as indicated by reference numeral 710 or 720 in FIG. 7 is applied.

In the case of LTPS, formed are a substrate 1700, a light shield 1702, a buffer layer 1704, a lightly-doped drain (LDD) 1706, an active layer 1708, a gate electrode 1710, a data electrode (source/drain) 1720, a gate insulating film 1722, an interlayer insulating film 1724, a first passivation layer (a planarization layer) 1726, a touch signal line 1730 for a touch driving signal, a pixel electrode 1740, a second passivation layer 1750, a common electrode 1760, and a connection pattern 1770 that connects the pixel electrode 1740 to the data electrode 1720. Here, the common electrode 1760 and the connection pattern 1770 are both formed of an identical material in one process step.

The features of the structure and the fabrication method proposed in an embodiment of the present disclosure may be applied to a VOT structure, to which a planarization layer is applied. However, the present disclosure is not limited thereto. Also, in the process of forming a common electrode, a pixel electrode may come into contact with a source/drain through a side contact. Further, when it is difficult to selectively dry-etch only an organic material during the dry etching of the organic material, a part of the organic material may remain, or a part of a lower first passivation layer may be etched together. In an example of a planarization layer in the present disclosure, a material of the planarization layer may be replaced by another organic material having a low permittivity. Examples of the material of the planarization layer may include a photosensitive material and a non-photosensitive material.

The process of reducing the number of masks, which is specified in the present disclosure, may be applied to all cases where backplanes are made of amorphous silicon, oxide, and LTPS. Also, the process of reducing the number of masks may be applied to a structure including a touch signal line layer.

The structures and the fabrication methods, which are proposed in the above-described embodiments of the present disclosure, can reduce the number of masks and the process steps, can improve productivity, and can reduce costs. Also, it is possible to ensure compatibility between a Pixel On Top (POT) structure and a VOT structure which is associated with the technique for reducing the number of masks which integrates Vcom/planarization layer.

While the technical spirit of the present disclosure has been exemplarily described with reference to the accompanying drawings, it will be understood by a person skilled in the art that the present invention may be varied and modified in various forms without departing from the scope of the present invention. Therefore, exemplary embodiments of the present disclosure have been described for the sake of brevity and clarity. The scope of the present disclosure shall be construed on the basis of the accompanying claims in such a manner that all of the technical ideas included within the scope equivalent to the claims belong to the present invention.

What is claimed is:

1. A display device comprising:
   a gate line over a substrate, the gate line in a first direction and the gate line configured to receive a gate signal;
   a data line over the substrate, the data line in a second direction and the data line configured to receive a data signal;
   a thin-film-transistor (TFT) including a drain electrode and a source electrode, the TFT located at a pixel defined by an intersection between the gate line and the data line;
   a first electrode located to be spaced apart from one of the source electrode and the drain electrode of the TFT;

a second electrode and a connection pattern over the first electrode;

a touch signal line disposed between the first electrode and the second electrode, and wherein the connection pattern is made of a same material as that of the second electrode, and wherein a first side of the touch signal line is in direct contact with a third electrode of a same material as the first electrode, and wherein a second side of the touch signal line is in direct contact with a fourth electrode of a same material as the second electrode and the connection pattern.

2. The display device of claim 1, wherein during a display mode of the display device the second electrode is a common electrode configured to receive a common voltage, and wherein during a touch mode of the display device the second electrode is a touch electrode configured to receive a touch driving signal.

3. The display device of claim 1, wherein the touch signal line configured to provide the touch driving signal to the second electrode.

4. The display device of claim 1, wherein the display device comprises one of a liquid crystal display device and an organic light emitting diode display device.

5. The display device of claim 1, wherein the first electrode is a pixel electrode of the display device.

6. The display device of claim 5, further comprising:

a first passivation layer on the TFT; and a second passivation layer on the pixel electrode;

wherein the second electrode is on the second passivation layer that separates the second electrode from a portion of the first electrode.

7. The display device of claim 1, further comprising:

a gate pad and a data pad over the substrate;

a gate pad cover over the gate pad and in direct contact with the gate pad; and a data pad cover over the data pad and in direct contact with the gate pad;

wherein the gate pad cover and the data pad cover are of the same material as the second electrode and the connection pattern.

8. A display device comprising:

a display panel comprising:

a plurality of gate lines over a substrate, the plurality of gate lines in a first direction and the plurality of gate lines configured to receive gate signals;

a plurality of data lines over the substrate, the plurality of data lines in a second direction and the plurality of data lines configured to receive data signals;

a thin-film-transistor (TFT) including a drain electrode and a source electrode, the TFT located at a pixel defined by an intersection between the one of the plurality of gate lines and one of the plurality of data lines;

a first electrode that is located to be spaced apart from one of the source electrode and the drain electrode of the TFT;

a second electrode and a connection pattern over the first electrode;

a touch signal line disposed between the first electrode and the second electrode;

a touch integrated circuit configured to apply a touch driving signal to the second electrode during a touch driving mode of the display device;

a data driver configured to transmit the data signals to the plurality of data lines during a display driving mode of the display device;

a gate driver configured to transmit the gate signals to the plurality of gate lines during the display driving mode of the display device, and wherein the connection pattern is made of a same material as that of the second electrode, and wherein a first side of the touch signal line is in direct contact with a third electrode of a same material as the first electrode, and wherein a second side of the touch signal line is in direct contact with a fourth electrode of a same material as the second electrode and the connection pattern.

9. The display device of claim 8, wherein the touch signal line configured to provide the touch driving signal to the second electrode.

10. The display device of claim 8, wherein the first electrode is a pixel electrode of the display device.

11. The display device of claim 10, further comprising:

a first passivation layer on the TFT; and a second passivation layer on the pixel electrode;

wherein the second electrode is on the second passivation layer that separates the second electrode from a portion of the first electrode.

12. The display device of claim 8, further comprising:

a gate pad and a data pad over the substrate;

a gate pad cover over the gate pad and in direct contact with the gate pad; and a data pad cover over the data pad and in direct contact with the gate pad;

wherein the gate pad cover and the data pad cover are of the same material as the second electrode and the connection pattern.

13. A method of fabricating a signal line of a display device including a touch sensor, the method comprising:

forming a thin-film-transistor (TFT) over a substrate, the TFT including a source electrode and a drain electrode;

forming a first passivation layer over the TFT, the first passivation layer covering the TFT;

forming a planarization layer over the first passivation layer;

forming a first electrode layer on the planarization layer;

forming a second electrode layer on the first electrode layer;

forming a touch signal line by etching the second electrode layer using a first photomask, the touch signal line configured to receive a touch driving signal;

forming a first electrode by etching the first electrode layer and the planarization layer using a second photomask;

applying a second passivation layer over the touch signal line and the first electrode;

exposing a part of the source electrode or a part of the drain electrode of the TFT by etching the first passivation layer and the second passivation layer using a third photomask; and forming a connection pattern that connects the first electrode to the exposed part of the source electrode or the drain electrode of the TFT using a fourth photomask.

14. The method of claim 13, wherein forming the first electrode comprises:

simultaneously forming the first electrode and the etched planarization layer using the second photomask.

15. The method of claim 13, wherein forming the touch signal line by etching the second electrode layer, the first electrode layer, and the planarization layer comprises:

forming the first electrode layer, the second electrode layer, and the planarization layer using the first photomask; and forming the touch signal line using a portion of the first photomask remaining after forming the first electrode layer, the second electrode layer, and the planarization layer.

16. The method of claim 13, further comprising:
forming a gate pad and a data pad on the substrate.

17. The method of claim 16, wherein exposing the part of the source electrode or the drain electrode comprises simultaneously exposing a part of the gate pad and a part of the data pad.

18. The method of claim 17, wherein forming the connection pattern comprises simultaneously forming a gate pad cover over the exposed part of the gate pad and a data pad cover over the exposed part of the data pad.

* * * * *